(12) United States Patent
Maeda

(10) Patent No.: US 12,568,787 B2
(45) Date of Patent: *Mar. 3, 2026

(54) IC CHIP MOUNTING DEVICE AND IC CHIP MOUNTING METHOD

(71) Applicant: SATO HOLDINGS KABUSHIKI KAISHA, Tokyo (JP)

(72) Inventor: Yoshimitsu Maeda, Tokyo (JP)

(73) Assignee: SATO CORPORATION, Tokyo (JP)

( * ) Notice: Subject to any disclaimer, the term of this patent is extended or adjusted under 35 U.S.C. 154(b) by 804 days.

This patent is subject to a terminal disclaimer.

(21) Appl. No.: 17/783,386

(22) PCT Filed: Dec. 25, 2020

(86) PCT No.: PCT/JP2020/048868
§ 371 (c)(1),
(2) Date: Jun. 8, 2022

(87) PCT Pub. No.: WO2021/132614
PCT Pub. Date: Jul. 1, 2021

(65) Prior Publication Data
US 2023/0013223 A1     Jan. 19, 2023

(30) Foreign Application Priority Data

Dec. 26, 2019   (JP) ................................. 2019-235377
Dec. 25, 2020   (JP) ................................. 2020-216376

(51) Int. Cl.
*B32B 41/00*          (2006.01)
*H01L 21/463*        (2006.01)
(Continued)

(52) U.S. Cl.
CPC ...... *H01L 21/67115* (2013.01); *H01L 21/463* (2013.01); *H01L 21/477* (2013.01); *H01L 21/67092* (2013.01); *H01L 21/67706* (2013.01)

(58) Field of Classification Search
CPC ............. H01L 21/67115; H01L 21/463; H01L 21/477; H01L 21/67092; H01L 21/67706;
(Continued)

(56) References Cited

U.S. PATENT DOCUMENTS

2004/0163243 A1     8/2004   Noda et al.
2007/0085069 A1     4/2007   Inoue et al.
(Continued)

FOREIGN PATENT DOCUMENTS

CN          203825037 U       9/2014
CN          110199379 A       9/2019
(Continued)

OTHER PUBLICATIONS

Office Action issued in connection with Chinese Appl. No. 202080085320.5 dated Jan. 22, 2025.
(Continued)

*Primary Examiner* — Michael N Orlando
*Assistant Examiner* — Joshel Rivera
(74) *Attorney, Agent, or Firm* — Foley & Lardner LLP

(57)          ABSTRACT

The present invention is an IC chip mounting apparatus including: a conveyor configured to convey an antenna continuous body on a conveying surface, the antenna continuous body having a base material and plural inlay antennas continuously formed on the base material; an IC chip placement unit configured to place an IC chip on a photocurable adhesive that is located on a reference position of each antenna in the antenna continuous body; and a light irradiator configured to irradiate, with light, the adhesive of each antenna of the antenna continuous body that is conveyed by the conveyor, wherein the light irradiator is configured to irradiate the adhesive of each antenna with the light, while the IC chip on the adhesive is pressed to the antenna.

20 Claims, 21 Drawing Sheets

AN    "E" PART

ENLARGED VIEW OF "E" PART (BEFORE IC CHIP IS MOUNTED)

ENLARGED VIEW OF "E" PART (AFTER IC CHIP IS MOUNTED)

(51) Int. Cl.
  *H01L 21/477* (2006.01)
  *H01L 21/67* (2006.01)
  *H01L 21/677* (2006.01)

(58) Field of Classification Search
  CPC ......... H01L 21/67259; H01L 21/67721; H01L
  21/6838; H01L 24/75; H01L 21/67132
  USPC .................... 156/60, 64, 350, 351, 378, 379
  See application file for complete search history.

(56) References Cited

U.S. PATENT DOCUMENTS

| | | |
|---|---|---|
| 2007/0284759 A1 | 12/2007 | Suguro et al. |
| 2010/0043203 A1 | 2/2010 | Ferguson et al. |
| 2010/0096089 A1 | 4/2010 | Lichtenberg et al. |
| 2010/0172737 A1 | 7/2010 | Munn |
| 2012/0304459 A1 | 12/2012 | Takayuki |
| 2013/0122610 A1 | 5/2013 | Chung et al. |
| 2016/0052197 A1 | 2/2016 | Yamada et al. |
| 2018/0053671 A1 | 2/2018 | Cheng et al. |
| 2018/0303015 A1 | 10/2018 | Koch et al. |
| 2019/0139795 A1 | 5/2019 | Neo et al. |
| 2023/0019546 A1* | 1/2023 | Maeda .................... H01L 24/83 |

FOREIGN PATENT DOCUMENTS

| | | |
|---|---|---|
| EP | 1 742 171 A1 | 1/2007 |
| EP | 1 833 290 A1 | 9/2007 |
| EP | 1 962 231 A2 | 8/2008 |
| JP | H06-029694 A | 2/1994 |
| JP | 11-157262 A | 6/1999 |
| JP | 2004-334639 A | 11/2004 |
| JP | 2005-209144 A | 8/2005 |
| JP | 2005-339502 A | 12/2005 |
| JP | 2006-309541 A | 11/2006 |
| JP | 2007-043086 A | 2/2007 |
| JP | 2007-183847 A | 7/2007 |
| JP | 2008-021167 A | 1/2008 |
| JP | 2008-077599 A | 4/2008 |
| JP | 2008-123406 A | 5/2008 |
| JP | 2011-198136 A | 10/2011 |
| JP | 2012-074570 A | 4/2012 |
| JP | 2012-206278 A | 10/2012 |
| JP | 2013-080795 A | 5/2013 |
| JP | 2015-053316 A | 3/2015 |
| JP | 2016-046281 A | 4/2016 |
| JP | 2016-133982 A | 7/2016 |
| JP | 6337271 B2 | 6/2018 |
| WO | WO-2019/057469 A1 | 3/2019 |

OTHER PUBLICATIONS

U.S. Appl. No. 17/782,744, filed Jun. 6, 2022, Yoshimitsu Maeda.
U.S. Appl. No. 17/783,376, filed Jun. 8, 2022, Yoshimitsu Maeda.
U.S. Appl. No. 17/783,819, filed Jun. 9, 2022, Yoshimitsu Maeda et al.
U.S. Appl. No. 17/783,830, filed Jun. 9, 2022, Yoshimitsu Maeda.
U.S. Appl. No. 17/783,837, filed Jun. 9, 2022, Yoshimitsu Maeda.
Non-Final Office Action in U.S. Appl. No. 17/783,819 dated Jun. 16, 2025.
Non-Final Office Action in U.S. Appl. No. 17/783,837 dated Jul. 30, 2025.
U.S. Appl. No. 19/344,393, filed Sep. 29, 2025, Yoshimitsu Maeda.
Office Action issued in Japanese Appl. No. 2024-211941 dated Oct. 14, 2025.
Office Action issued in Chinese Appl. No. 202080085319.2 dated Oct. 31, 2025.
Office Action issued in Japanese Appl. No. 2024-223808 dated Nov. 11, 2025.

* cited by examiner

AN     "E" PART

ENLARGED VIEW OF "E" PART (BEFORE IC CHIP IS MOUNTED)

ENLARGED VIEW OF "E" PART (AFTER IC CHIP IS MOUNTED)

ENLARGED VIEW OF A-A SECTION

SEEN FROM ARROW "J"

PRESS UNIT

PULLED STATE　　　　　　RESSING STATE

IC CHIP MOUNTING DEVICE AND IC CHIP MOUNTING METHOD

FIELD

The present invention relates to an IC chip mounting apparatus and an IC chip mounting method.

BACKGROUND

With the spread of RFID tags, production of sheet-shaped inlays having an antenna and an IC chip electrically connected to the antenna is increasing. Manufacturing of an inlay involves a process of: providing an adhesive at a predetermined reference position on an antenna formed on a base material; and placing an IC chip at the reference position. The reference position is a reference for mounting the IC chip. Subsequently, the IC chip is fixed by curing with the adhesive.

For example, Japanese Unexamined Patent Application Publication No. 2012-206278 discloses an adhesive curing method that photo-curable adhesives are cured by irradiating light while four components on a base plate are pressed by four press tools.

BRIEF SUMMARY

Technical Problem

Conventionally, conveying a component such as an IC chip is stopped while the component is fixed by curing an adhesive, which make it difficult to achieve productivity gain.

In view of this, an object of one aspect of the present invention is to achieve productivity gain in an inlay manufacturing process.

Solution to Problem

An embodiment of the present invention is an IC chip mounting apparatus including a conveyor configured to convey an antenna continuous body on a conveying surface, the antenna continuous body having a base material and plural inlay antennas continuously formed on the base material; an IC chip placement unit configured to place an IC chip on a photo-curable adhesive that is located on a reference position of each antenna in the antenna continuous body; and a light irradiator configured to irradiate, with light, the adhesive of each antenna of the antenna continuous body that is conveyed by the conveyor, wherein the light irradiator is configured to irradiate the adhesive of each antenna with the light, while the IC chip on the adhesive is pressed to the antenna.

Advantageous Effects

An embodiment of the present invention achieves productivity gain in an inlay manufacturing process.

DETAILED DESCRIPTION

The present invention is related to Japanese Patent Application Nos. 2019-235377 and 2020-216376 respectively filed with the Japan Patent Office on Dec. 26, 2019 and on Dec. 25, 2020, the entire contents of which are incorporated into this specification by reference.

Hereinafter, an IC chip mounting apparatus and an IC chip mounting method according to an embodiment will be described with reference to drawings.

An IC chip mounting apparatus 1 according to the embodiment is an apparatus for mounting an IC chip on a thin film antenna in manufacturing a contactless communication inlay, such as an RFID inlay.

Figure 1:
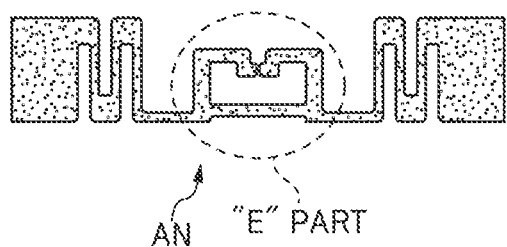
FIG. 1 shows a plane view of an antenna of an embodiment and partially enlarged views of the antenna before and after an IC chip is mounted.
Figure 1:
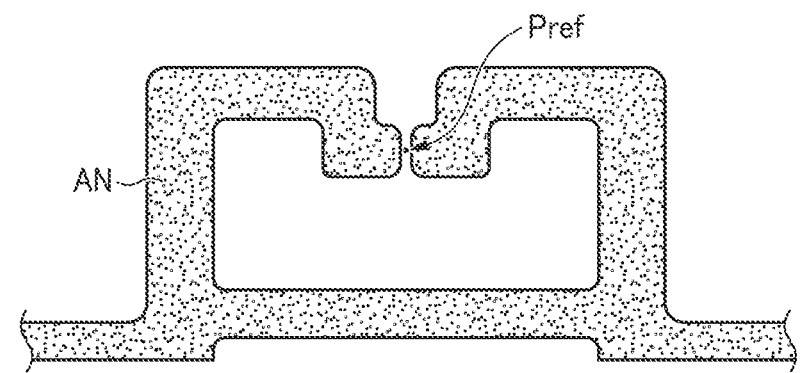
Figure 1:
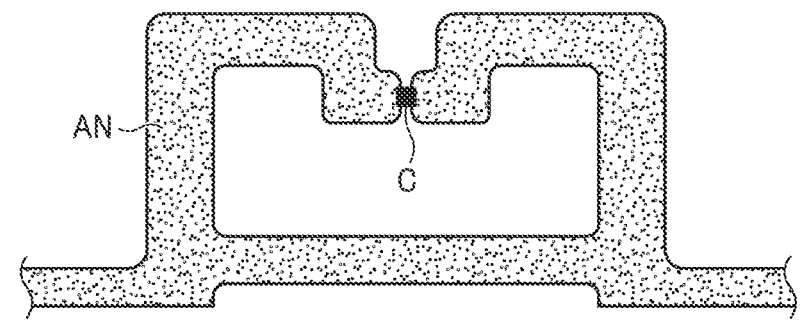

FIG. 1 shows an exemplary antenna AN having a predetermined antenna pattern, but there is no intention to limit the antenna pattern thereto. FIG. 1 also shows enlarged views of an "E" part before and after an IC chip "C" is mounted on the antenna AN. In this example, an IC chip "C" is mounted at a predetermined reference position Pref that is determined in advance based on the antenna pattern. The IC chip "C" has such a very small size as several hundreds of micrometers in length and width dimensions, and this very small IC chip "C" is required to be mounted exactly at the reference position Pref.

Mounting the IC chip "C" on the antenna AN involves an IC chip placement process and a curing process. In the IC chip placement process, an adhesive is applied to the reference position Pref of the antenna AN, and the IC chip "C"

is placed on the adhesive. In the curing process, the adhesive is cured to strongly connect the antenna AN and the IC chip "C".

Figure 2:
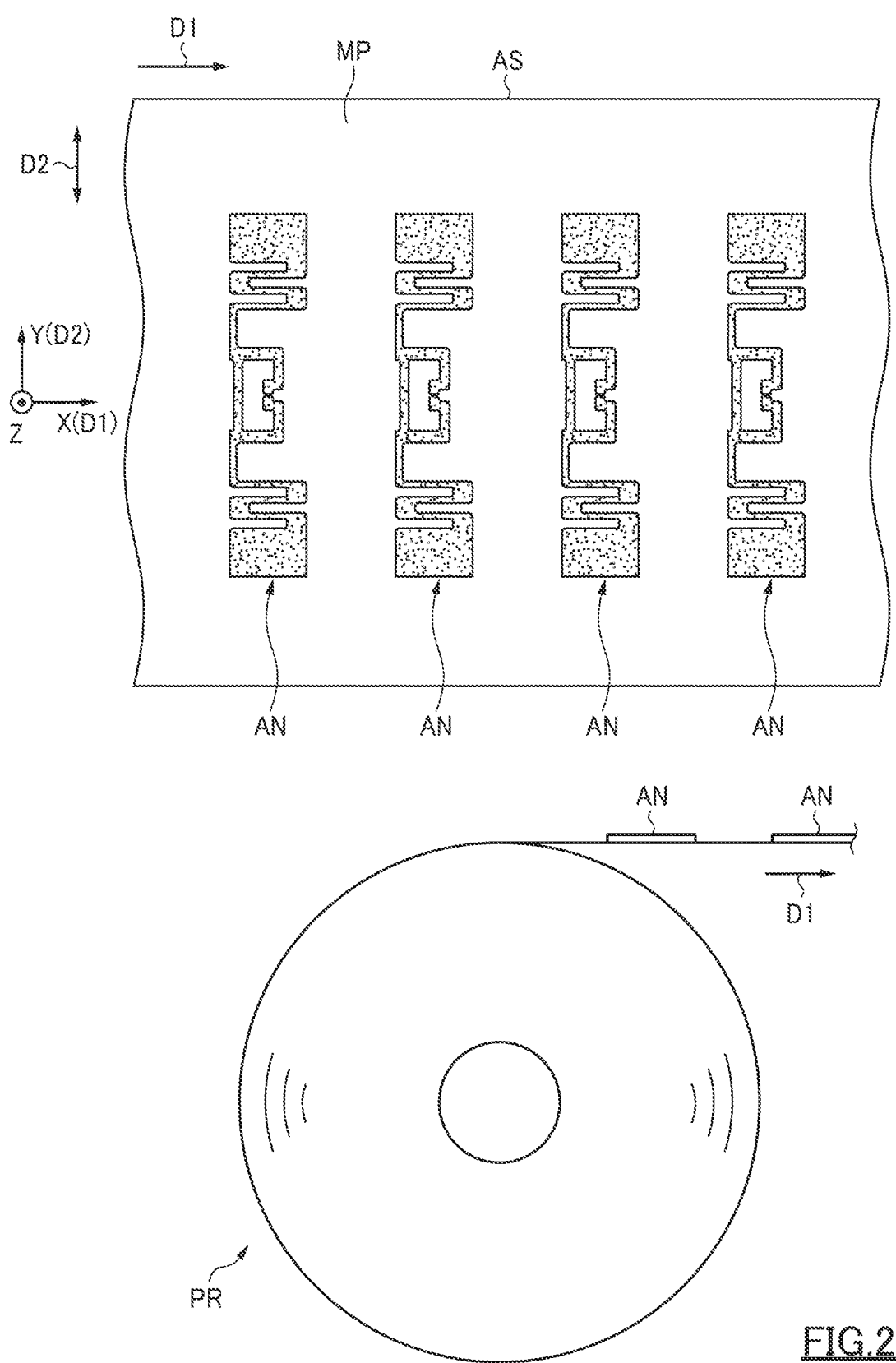
FIG. 2 shows an antenna sheet and a roll of the antenna sheet.

In the IC chip placement process (described later), a roll PR of a strip antenna sheet AS (an example of an antenna continuous body), as shown in FIG. 2, is set. The antenna sheet AS includes a plurality of antennas AN formed on a base material BM with constant pitches. The antenna sheet AS is continuously pulled out of the roll PR and is provided to a line of the IC chip placement process.

Examples of the material that can be used for the base material BM include, but not specifically limited to, paper base materials such as fine paper, coated paper, and art paper, synthetic resin films made of polyethylene terephthalate (PET), polyethylene (PE), polypropylene (PP), or polystyrene (PS), sheets made of a plurality of these synthetic resins, and composite sheets of a synthetic resin film and paper.

The antenna AN is formed, for example, by attaching a metal foil to a base material BM or by screen-printing or vapor-depositing a conductive material into a predetermined pattern on a base material BM.

In the following description, an XYZ coordinate system is defined as shown in FIG. 2. The following describes a front view as a YZ-plane view, a plane view as an XY-plane view, and a side view as an XZ-plane view in referring to the drawings of components set in each process.

The X-direction is a direction of conveying the antenna sheet AS, which is pulled out of the roll PR, in each process described below, and it is also called a "conveying direction D1" as appropriate. In addition, the Y-direction is a width direction of the antenna sheet AS and is also called a "width direction D2" as appropriate. The Z-direction is a direction orthogonal to the antenna sheet AS.

(1) IC Chip Placement Process

Figure 3:
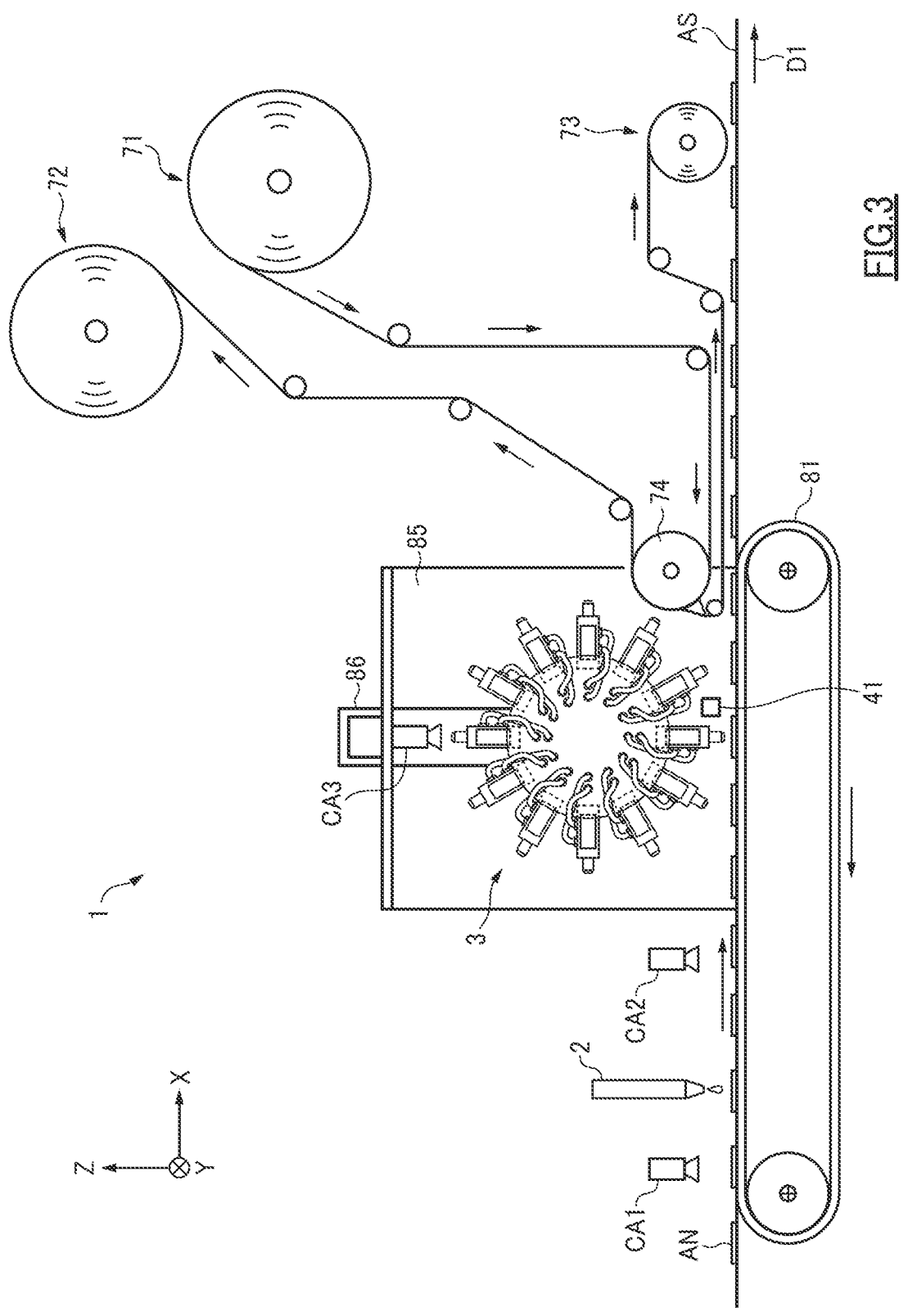
FIG. 3 shows an area corresponding to an IC chip placement process of an IC chip mounting apparatus of an embodiment.
Figure 4:
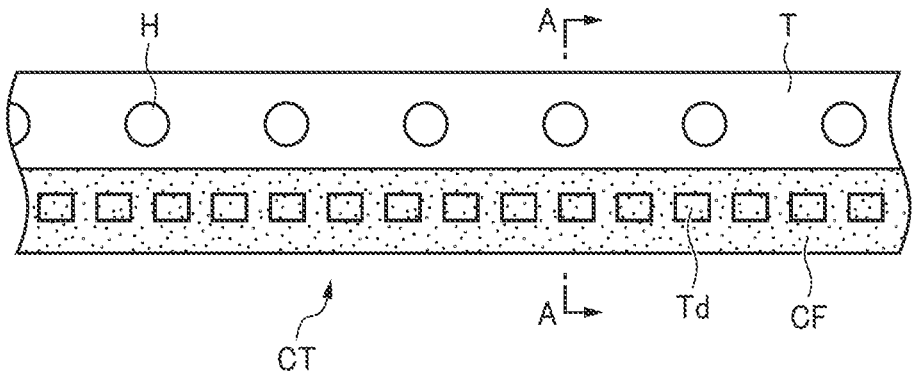
FIG. 4 shows a chip-containing tape and an enlarged sectional view thereof.
Figure 4:
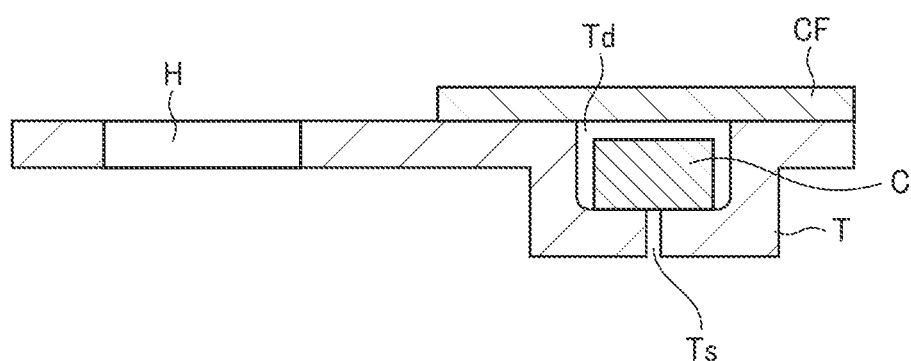

Hereinafter, the IC chip placement process will be described with reference to FIGS. 3 to 10. FIG. 3 shows an area corresponding to the IC chip placement process of the IC chip mounting apparatus 1 of this embodiment. FIG. 4 shows a plane view of a chip-containing tape CT and an enlarged view of an A-A section thereof.

In the IC chip placement process, the IC chip mounting apparatus 1 accurately places a very small IC chip at the reference position Pref (refer to FIG. 1) of each antenna AN on the antenna sheet AS.

As shown in FIG. 3, the IC chip mounting apparatus 1 includes a conveyor 81, a dispenser 2, a rotary mounter 3, an ultraviolet irradiator 41, image capture devices CA1 to CA3, a tape feeder 71, a tape body winding reel 72, a film winding reel 73, and a separation roller 74, in the IC chip placement process.

The conveyor 81 (an example of a conveyer) conveys the antenna sheet AS that is pulled out of the roll PR (refer to FIG. 2) to the downstream of the process at a predetermined conveying speed. An upper surface of the conveyor 81 corresponds to a conveying surface.

The dispenser 2 ejects a fixed amount of anisotropic conductive paste (ACP; hereinafter simply called "conductive paste") to the reference position Pref of each antenna AN that is conveyed. This conductive paste is an example of an ultraviolet light curable adhesive. The dispenser 2 is configured so that the ejection position can be adjusted in the width direction, in order to accurately determine the ejection position relative to the reference position Pref of each antenna AN.

The image capture device CA1 is provided upstream of the dispenser 2 and captures an image of a part in the vicinity of the reference position Pref of each antenna AN, in order to determine the position to be applied with the conductive paste. The image capture device CA2 is provided downstream of the dispenser 2 and captures an image of a part in the vicinity of the reference position Pref of each antenna AN, in order to inspect whether the conductive paste is applied to each antenna AN and to inspect whether the conductive paste is applied exactly to a region including the reference position Pref.

The rotary mounter 3 (an example of an IC chip placement unit) is a chip mounter that places an IC chip on the conductive paste that is applied to each antenna AN, and it rotates in a counterclockwise direction in FIG. 3. The rotary mounter 3 is mounted to a suspension plate 86, and the suspension plate 86 is fixed to a support stand 85. That is, the rotary mounter 3 is suspended from above by the support stand 85.

As described later, the rotary mounter 3 sucks an IC chip from the chip-containing tape and places (mounts) the sucked IC chip by releasing it to the reference position Pref of each antenna AN on the antenna sheet AS. Meanwhile, in order to place the IC chip exactly at the reference position Pref of the antenna AN, the position and the direction of the sucked IC chip are corrected. The image capture device CA3 images the IC chip in the state of being sucked by a nozzle (described later), in order to perform a correction process of correcting the position and the direction of the IC chip in preparation for mounting it on the antenna AN.

The tape feeder 71 is configured to be loaded with a wound chip-containing tape that contains IC chips and to cause the chip-containing tape to be pulled out sequentially at a speed synchronized with the rotary mounter 3, in the arrow directions in FIG. 3.

Herein, an example of the chip-containing tape will be described with reference to FIG. 4.

As shown in FIG. 4, the chip-containing tape CT includes a tape body "T" and a cover film CF. Recesses Td for containing IC chips "C" are formed at fixed intervals in the tape body "T". The cover film CF is attached to the tape body "T" so as to cover the recesses Td. The recesses Td are formed, for example, by embossing the tape body "T". The IC chip "C" is contained in each recess Td along the extending direction of the chip-containing tape CT. The chip-containing tape CT has fitting holes H that are formed at fixed intervals in the extending direction. These fitting holes H are provided in order to accurately perform positioning relative to a circumferential surface of the separation roller 74. The fitting holes H are fitted to protrusions 74p (described later), which are provided to the separation roller 74, while the chip-containing tape CT is conveyed by the separation roller 74.

As shown in FIG. 4, a suction hole Ts is formed between a bottom surface of the recess Td and a back surface (surface on a side opposite to the surface attached with the cover film CF) of the tape body "T". The suction hole Ts is provided so as to make the separation roller 74 suck an IC chip "C", in order to prevent the IC chip "C" from falling out of the recess Td when the cover film CF is peeled off.

With reference to FIG. 3 again, the chip-containing tape CT is fed from the tape feeder 71 via one or a plurality of auxiliary rollers, and the cover film CF is peeled off from the chip-containing tape CT to be separated from the tape body "T" at the separation roller 74. The IC chip "C" is exposed upon peeling off the cover film CF and is sequentially sucked by each nozzle that is provided to the rotary mounter 3.

After the chip-containing tape CT is separated into the tape body "T" and the cover film CF by the separation roller 74, the tape body "T" is wound by the tape body winding reel 72 via one or a plurality of auxiliary rollers, whereas the cover film CF is wound by the film winding reel 73 via one or a plurality of auxiliary rollers.

Next, the rotary mounter 3 will be described with reference to FIGS. 5 and 6.

Figure 5:
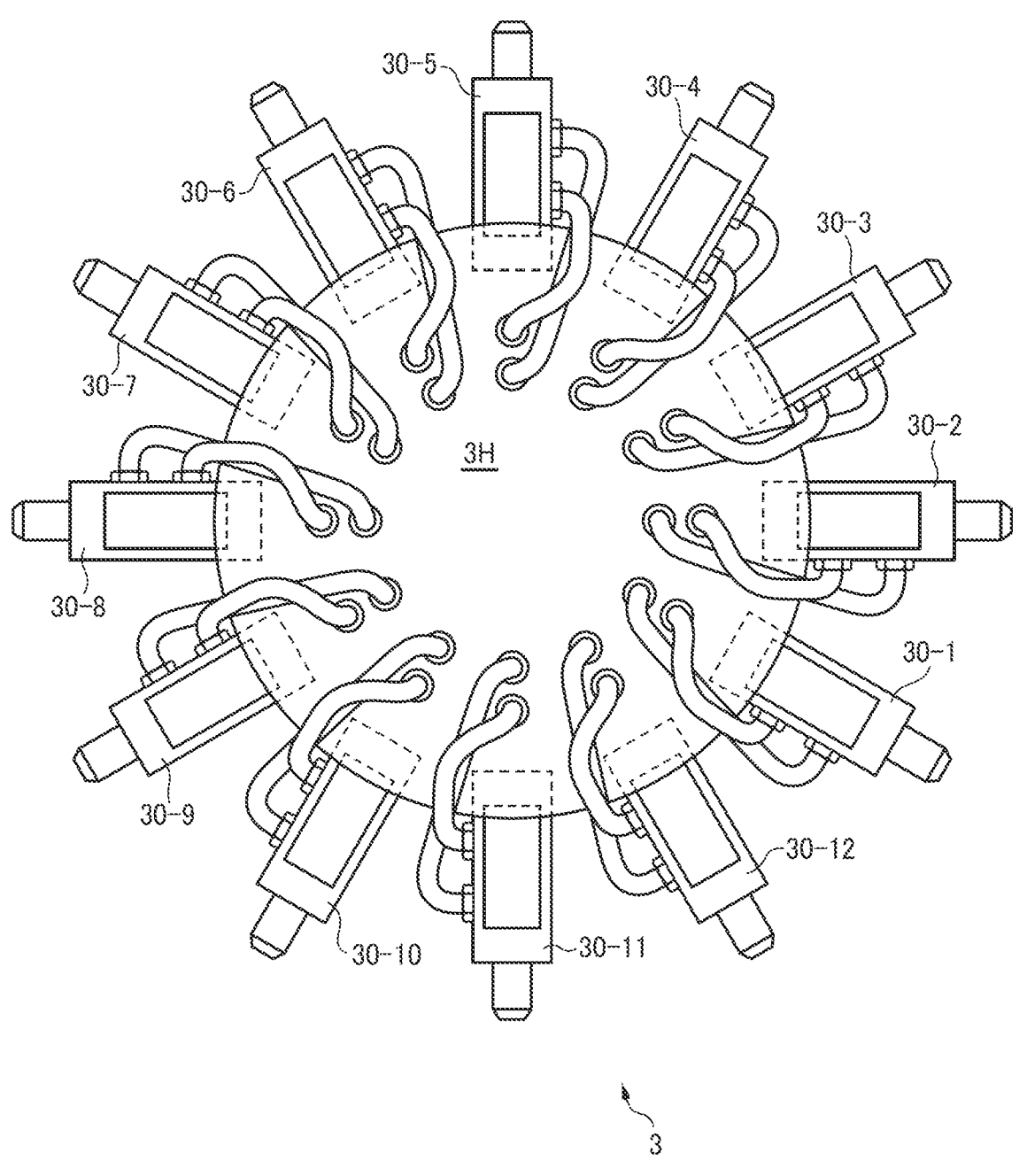
FIG. 5 is a side view of a rotary mounter of the IC chip mounting apparatus of the embodiment.

FIG. 5 is a side view of the rotary mounter 3 of the IC chip mounting apparatus 1 of this embodiment. FIG. 6 schematically illustrates a relation between the rotary mounter 3 and the antenna sheet AS.

As shown in FIG. 5, a plurality of nozzle units (twelve units in the example of the drawing) 30-1 to 30-12 are arranged radially from a rotary head 3H in the rotary mounter 3. The following collectively describes the nozzle units 30-1 to 30-12 as "nozzle units 30" when referring to matters that are common therebetween.

Although not illustrated in detail, the rotary head 3H is connected to a rotary drive motor, a vacuum pump, and a blower. The rotary drive motor rotates the nozzle units 30-1 to 30-12 in a counterclockwise direction in FIG. 5. The vacuum pump causes the nozzle unit 30 to suck an IC chip. The blower causes the nozzle unit 30 to release the IC chip.

Figure 6:
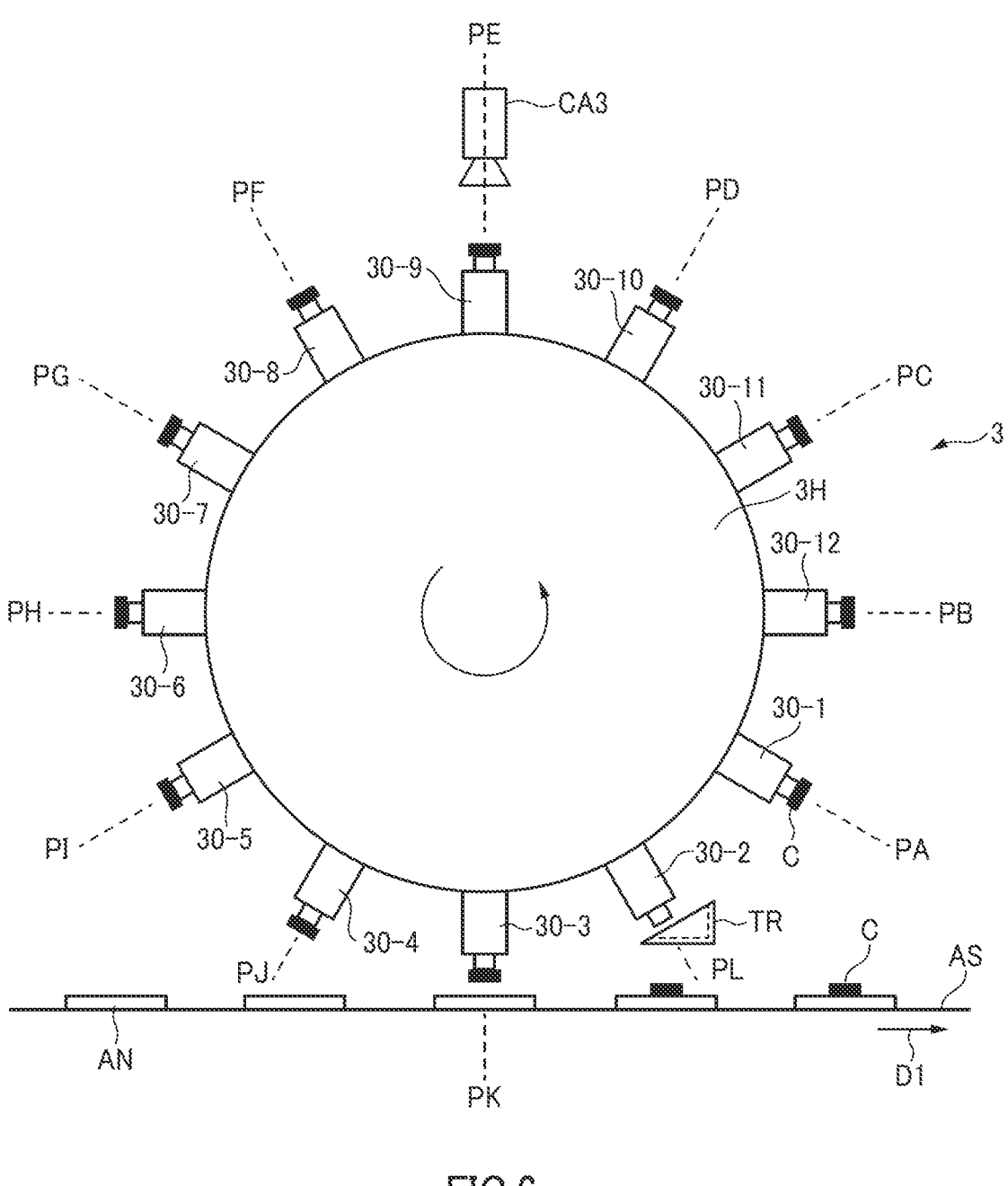
FIG. 6 schematically illustrates a relation between the rotary mounter and the antenna sheet.

With reference to FIG. 6, the rotary head 3H is rotated in a counterclockwise direction by the rotary drive motor (not shown), and accordingly, the positions on the circumference of the rotary head 3H of the nozzle units 30 are switched one by one. In more detail, one nozzle unit 30 sequentially shifts twelve positions PA to PL from the position PA to the position PL on the circumference of the rotary head 3H in the counterclockwise direction in such a manner as to move on a circular track on a flat plane orthogonal to the conveying surface, in accordance with rotation of the rotary head 3H.

Herein, the position PA is a position where the nozzle unit 30 sucks a new IC chip "C" from the chip-containing tape CT. The position PE is a position where the image capture device CA3 images the IC chip "C" in the state of being sucked by the nozzle of the nozzle unit 30.

The position PK is a position where the sucked IC chip "C" is released on the conductive paste applied to the antenna AN of the antenna sheet AS that is conveyed. The moving direction of the top of the nozzle matches the conveying direction D1 of the antenna sheet AS at the position PK. The nozzle unit 30 discharges air from the nozzle to release the IC chip "C" at the position PK.

The nozzle unit 30 does not suck the IC chip "C" at the position PL, as it has released the IC chip "C" at the position PK. In order to remove dust that may adhere to the nozzle, air may be jetted out from the nozzle at the position PL. FIG. 6 shows an example of disposing a dust collection tray TR for collecting dust that may be detached from the nozzle, at the position PL.

In an example, the following movement is repeated. In FIG. 6, the nozzle unit 30-1 at the position PA sucks a new IC chip "C" thereat and rotates in the counterclockwise direction while sucking the IC chip "C", and it then releases the IC chip "C" upon reaching the position PK and returns to the position PA to suck a new IC chip "C" again. Such an IC chip mounting method enables continuously placing the IC chip on each antenna AN without stopping conveyance of the antenna sheet AS, resulting in high productivity.

The angular velocity of the rotary head 3H and the conveying speed of the antenna sheet AS are set or controlled so that the nozzle unit 30, which sequentially reaches the position PK, will release the IC chip "C" to the reference position Pref of each antenna AN of the antenna sheet AS, which is conveyed from the upstream side. In order to accurately place the IC chip "C", it is preferable to provide a section where the speed of the top of the nozzle unit 30 is equal to the conveying speed of the antenna sheet AS, in proximity to the position PK.

Note that this embodiment shows an example of arranging twelve nozzle units 30 to the rotary head 3H, but the number of the nozzle units 30 is not limited thereto. The number of the nozzle units 30 that are arranged to the rotary head 3H can be set to any number.

Next, movement of the nozzle unit 30 sucking the IC chip "C" will be described with reference to FIGS. 7 and 8.

Figure 7:
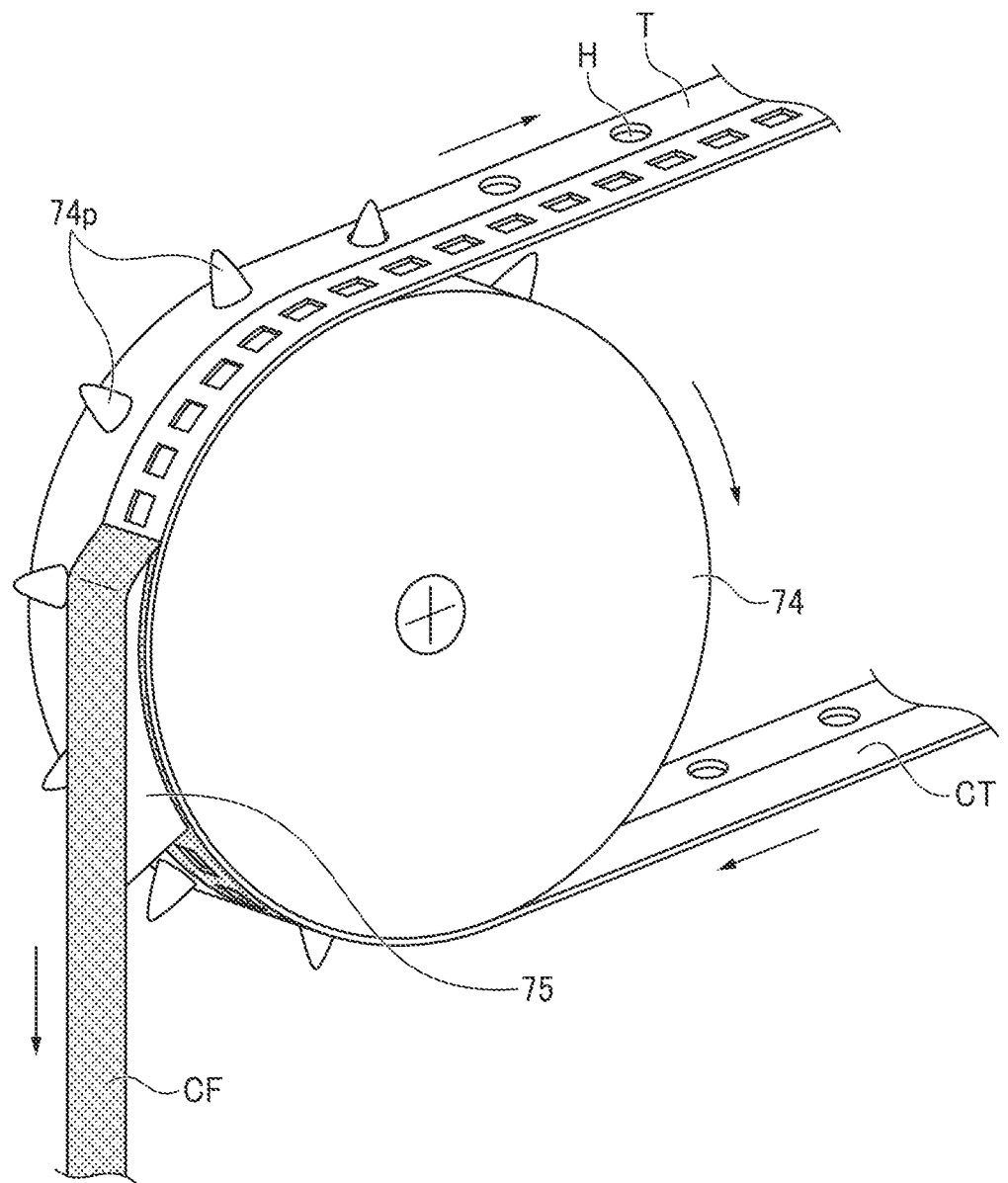
FIG. 7 is a perspective view showing separation of the chip-containing tape by a separation roller.

FIG. 7 is a perspective view showing separation of the chip-containing tape CT by the separation roller 74. FIG. 8 is a side view of the vicinity of the separation roller 74, illustrating movement of supplying the IC chip "C" to the nozzle unit 30 from the chip-containing tape CT. In order to show the state of the chip-containing tape CT, only the chip-containing tape CT is illustrated in cross-section in FIG. 8.

As shown in FIG. 7, the chip-containing tape CT, which is supplied from the tape feeder 71, is conveyed while its position in the width direction is determined by inserting the protrusions 74p of the separation roller 74 into the fitting holes H of the chip-containing tape CT. At this time, the cover film CF is peeled off from the chip-containing tape CT by a split member 75 and is sent to the film winding reel 73. On the other hand, the tape body "T" of the chip-containing tape CT is sent to the tape body winding reel 72.

Figure 8:
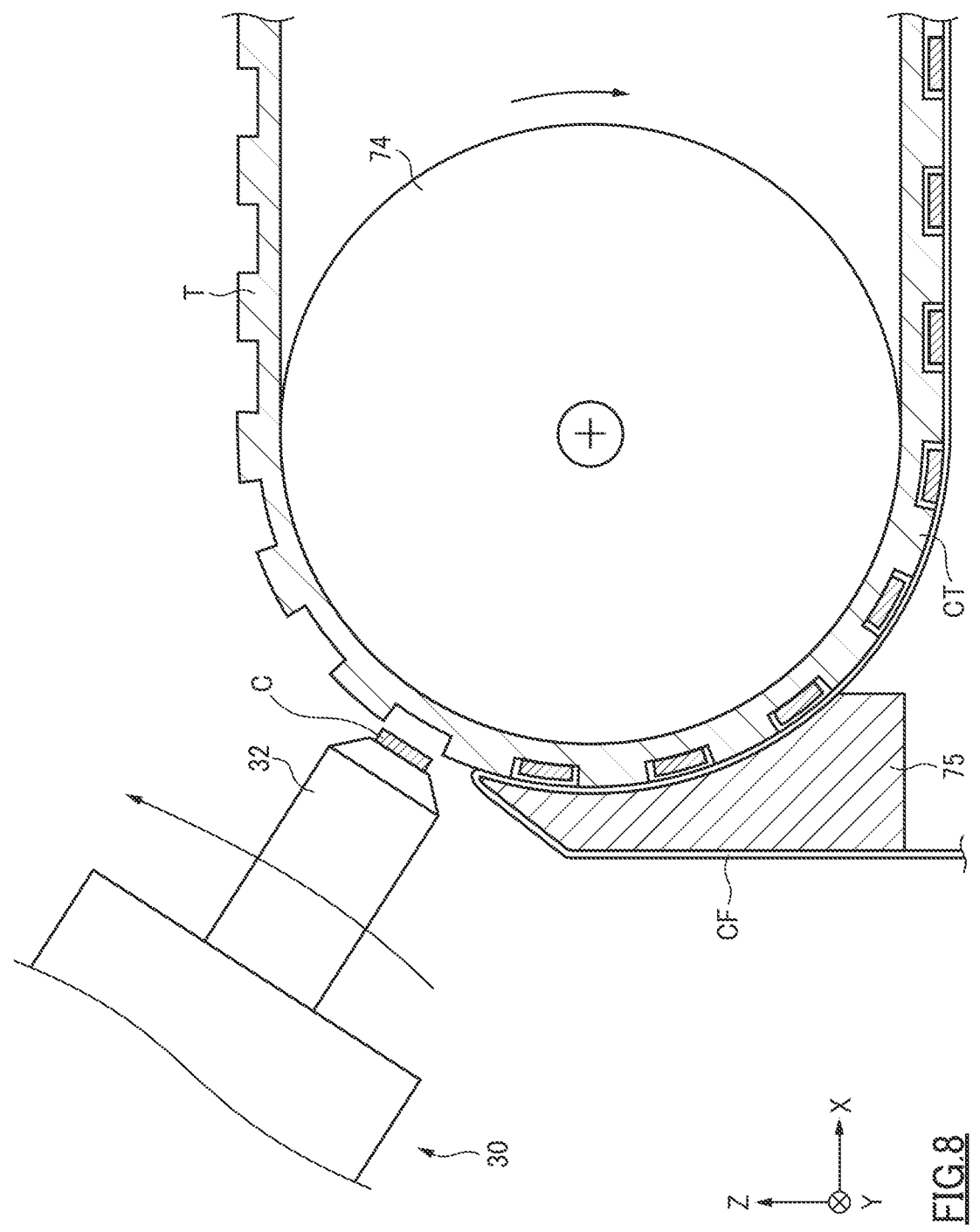
FIG. 8 illustrates movement of supplying an IC chip to a nozzle unit from the chip-containing tape.

As shown in FIG. 8, the IC chip "C" that is exposed due to peeling off of the cover film CF is immediately sucked by the nozzle unit 30. The separation roller 74 is provided with a suction path (not shown) for sucking the IC chip "C" toward the rotation center of the separation roller 74, so that the IC chip "C" will not fall out during a short period from a time when the IC chip "C" is exposed until it is sucked by the nozzle unit 30. The IC chip "C" is sucked through this suction path and the suction hole Ts (refer to FIG. 4) provided to the tape body "T".

(2) Curing Process

Next, the curing process will be described with reference to FIGS. 9 to 15.

The curing process involves curing the conductive paste, which is applied to each antenna and undergoes the IC chip placement process, whereby the physical connection between the antenna and the IC chip is strengthened, and the electrical conduction between the antenna and the IC chip is reliably made.

Figure 9:
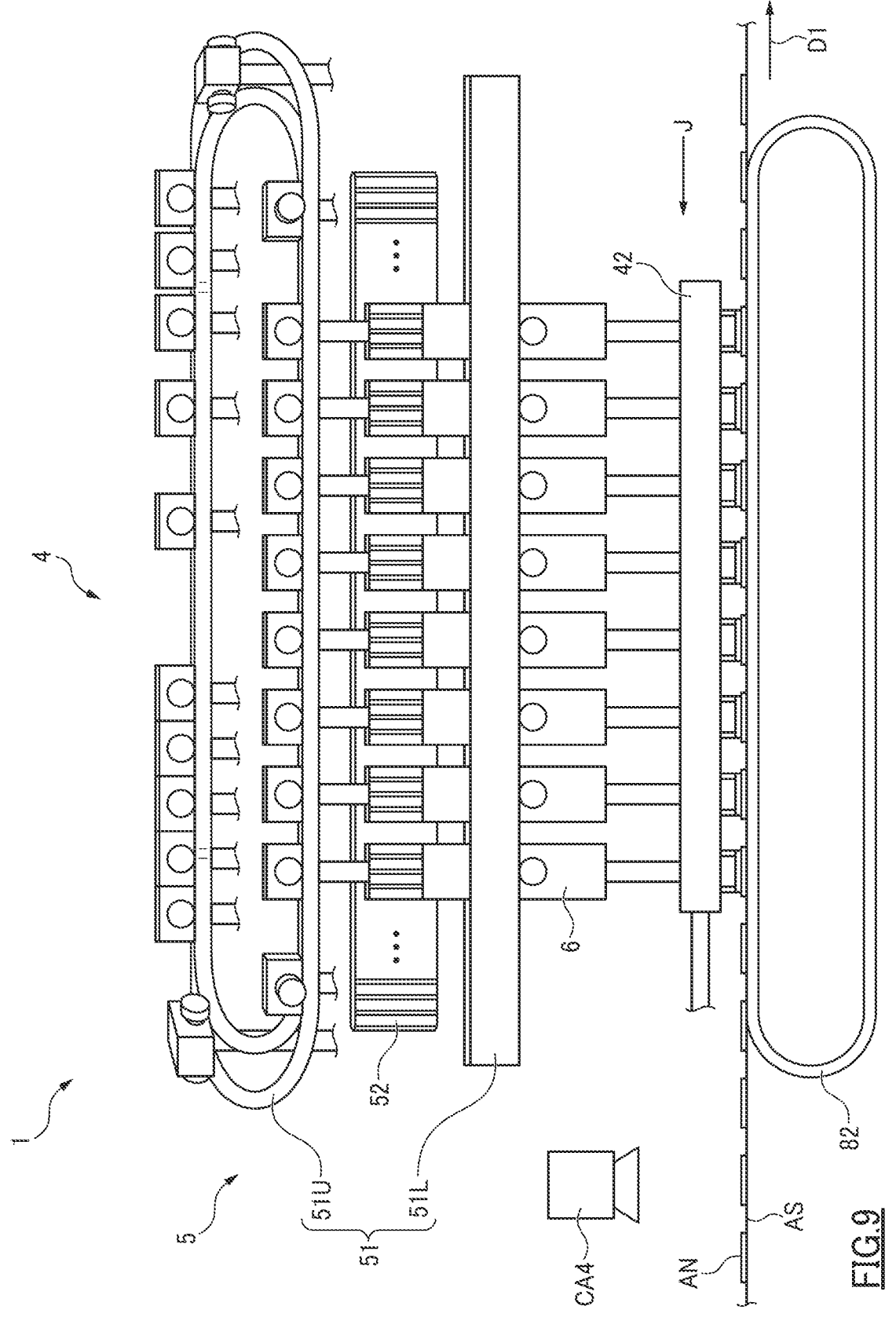
FIG. 9 shows an area corresponding to a curing process of the IC chip mounting apparatus of the embodiment.
Figure 10:
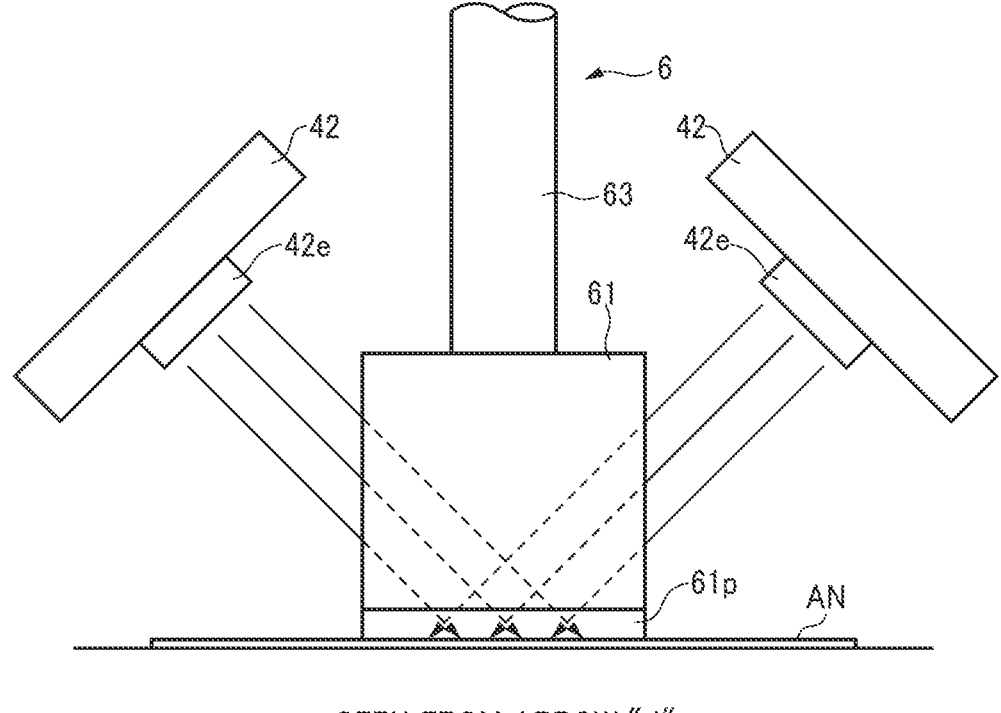
FIG. 10 shows a part of a press unit and an ultraviolet irradiator as seen from the arrow "J" in FIG. 9.
Figure 11:
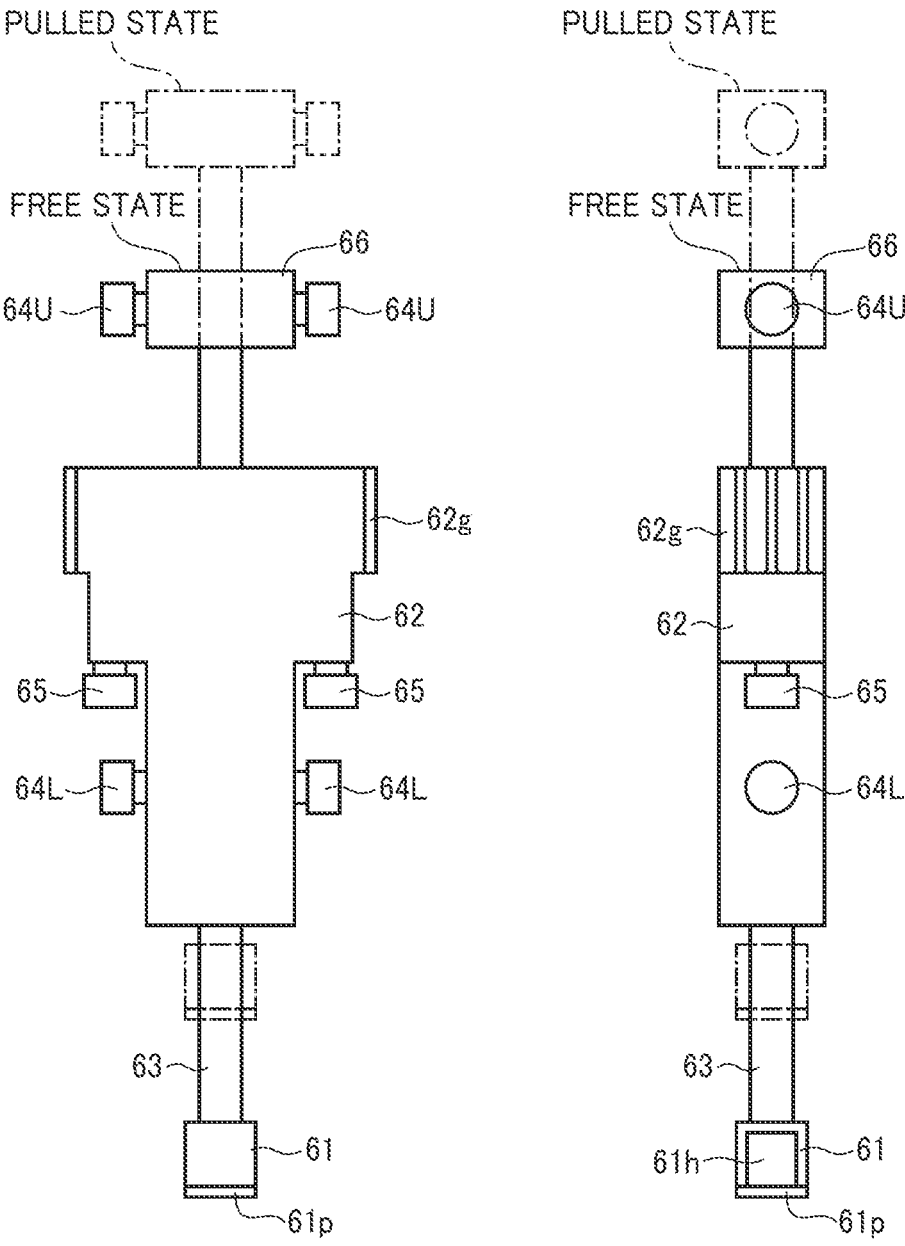
FIG. 11 shows a front view and a side view of the press unit included in a curing device of the embodiment.
Figure 12:
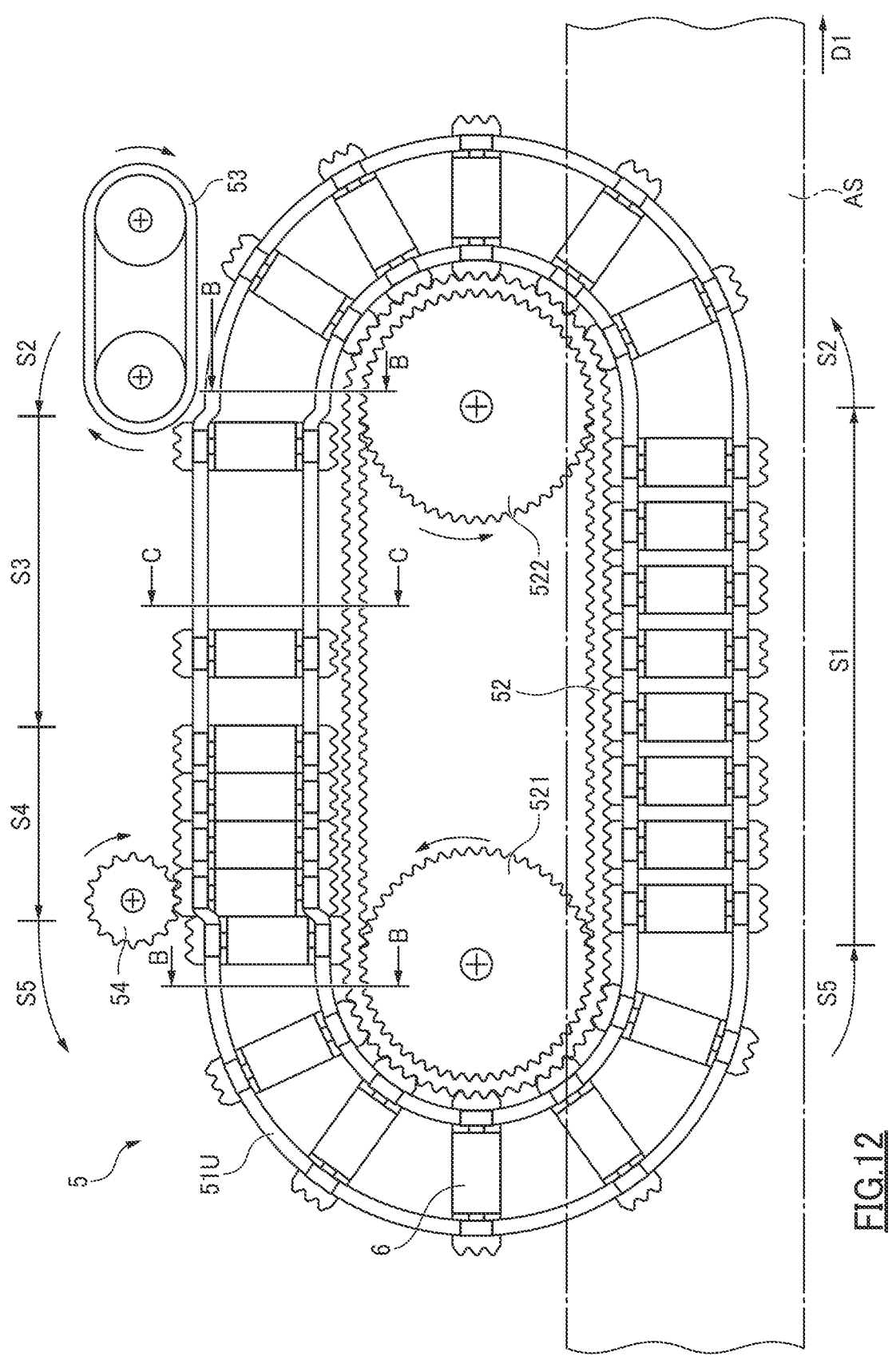
FIG. 12 is a plane view of a press unit circulation machine included in the curing device of the embodiment.

FIG. 9 shows an area corresponding to the curing process of the IC chip mounting apparatus 1 of this embodiment. FIG. 10 shows a part of a press unit 6 and ultraviolet irradiators 42 as seen from the arrow "J" in FIG. 9. FIG. 11 shows the press unit 6 included in a curing device 4 of this embodiment. FIG. 12 is a plane view of a press unit circulation machine 5 included in the curing device 4 of this embodiment. Note that FIG. 12 omits a lower rail 51L (described later).

As shown in FIG. 9, the IC chip mounting apparatus 1 includes a conveyor 82, a curing device 4, and an image capture device CA4, in the curing process.

The conveyor 82 conveys the antenna sheet AS that is conveyed from the upstream IC chip placement process to a downstream side at a predetermined conveying speed. An upper surface of the conveyor 82 corresponds to a conveying surface.

The image capture device CA4 is disposed above the antenna sheet AS on the most upstream of the curing process (that is, the most downstream of the IC chip placement process) and captures an image of each antenna AN that is conveyed from the IC chip placement process. The image capture device CA4 is provided in order to inspect whether the IC chip is placed at an appropriate position in the IC chip placement process.

As shown in FIG. 9, the curing device 4 includes a press unit circulation machine 5 as a press unit moving machine and ultraviolet irradiators 42 (examples of a light irradiator). As shown in FIGS. 9 and 12, the press unit circulation machine 5 includes a circulation rail 51 composed of an upper rail 51U and a lower rail 51L, a main belt 52, gears 521 and 522, an auxiliary belt 53, a feed gear 54, and press units 6.

The press unit circulation machine 5 circulates the press units 6 on a predetermined circular track.

The press unit 6 moves up and down in the direction orthogonal to the conveying surface, and it presses the IC chip, which is placed on the conductive paste of the antenna AN, while the antenna AN is being irradiated with ultraviolet light. The press unit circulation machine 5 may have any number of the press units 6, but it is preferably configured so that the number of the press units 6 can be set to any number of two or more from the point of view of productivity and cost.

The ultraviolet irradiators 42 are arranged along the conveying direction D1. Thus, it is possible to irradiate many antennas AN on the antenna sheet AS with ultraviolet light simultaneously.

In the IC chip mounting apparatus 1 of this embodiment, a thermosetting adhesive, such as an epoxy resin, may be applied to the antenna AN by the dispenser 2, and a thermosetting device with a heating unit, such as a heater, may be provided instead of the ultraviolet irradiator 42.

As shown in FIG. 9, preferably, a plurality of press units 6 (eight units in the example of the drawing) simultaneously and respectively press the IC chips that are placed on the conductive paste of a plurality of antennas (eight antennas in the example of the drawing) AN being conveyed. At this time, while the plurality of the press units 6 that are pressing and the plurality of the pressed antennas AN are moved at the same speed in the conveying direction D1 without stopping the conveyor 82 conveying the antenna sheet AS, the ultraviolet irradiators 42 irradiate each antenna AN with ultraviolet light. This leads to a very high productivity in fixing the IC chip to the antenna AN.

FIG. 10 shows a state in which each antenna AN is irradiated with ultraviolet light by the ultraviolet irradiators 42.

The ultraviolet irradiator 42 has a light source 42e, such as a light emitting device (LED). The light source 42e is configured to emit ultraviolet light to the antenna AN from a direction oblique to the conveying surface.

The press unit 6 is open at a side surface (that is a surface on a side on which the ultraviolet irradiator 42 is disposed) of a pressing part 61. A glass plate 61p is a pressing surface of the pressing part 61 and is made of glass through which ultraviolet light passes.

Next, the structure of the press unit 6 will be described with reference to FIG. 11.

As shown in FIG. 11, the press unit 6 includes a pressing part 61, a housing 62, a shaft 63, and a roller holder 66. A pair of lower rollers 64L and a pair of lateral rollers 65 that rotate on the lower rail 51L are attached to the housing 62. A pair of upper rollers 64U that rotate on the upper rail 51U are attached to the roller holder 66. The lower rollers 64L and the upper rollers 64U are suitable for rotating on a horizontal plane, whereas the lateral rollers 65 are suitable for rotating on a vertical plane.

The shaft 63 is coupled to the pressing part 61 at an end and is also coupled to the roller holder 66 at the other end. The shaft 63 is displaceable relative to the housing 62 in the upper-lower direction in FIG. 11.

A spring (not shown) is incorporated into the housing 62. FIG. 11 shows an external force-free state by solid lines and shows a pulled state (external force-applied state) by virtual lines, with respect to the pressing part 61, the shaft 63, and the roller holder 66. Upon releasing the external force, the pulled state is returned to the free state by the restoring force of the spring.

Although a coil spring may be used as the spring, a magnetic spring is preferably used. A magnetic spring provides a constant pressing force irrespective of the stroke amount and thereby hardly damages the IC chip. In addition, the magnetic spring deteriorates little in characteristics after a long time use.

The housing 62 is formed with a pair of V groove parts 62g. The number of grooves of the V groove part 62g is not specifically limited, but each groove has a shape that fits to the main belt 52 and the feed gear 54.

The housing 62 preferably contains a permanent magnet. The incorporated permanent magnets causes a plurality of the press units 6 to overlap one another in a waiting section due to the magnetic forces, and therefore, the press unit 6 is fed out at exact timing, as described later.

A space 61h is formed on a side having the V groove part 62g in the pressing part 61, and the glass plate 61p that transmits ultraviolet light is attached to the bottom of the pressing part 61. As shown in FIG. 10, while being irradiated by the ultraviolet irradiator 42, the IC chip is pressed by the bottom surface of the glass plate 61p. Providing the glass plate 61p, which transmits ultraviolet light, at the bottom of the pressing part 61 enables pressing the IC chip while irradiating it with ultraviolet light.

With reference to FIG. 12, in the press unit circulation machine 5, the gears 521 and 522 are driven by a main belt drive motor M41 (not shown in FIG. 12) so as to rotate at a constant angular velocity in a counterclockwise direction. In accordance with rotation of the gears 521 and 522, the main belt 52 that engages with each gear circulates around the gears 521 and 522 at a constant speed along the track of the press units 6.

The auxiliary belt 53 is, for example, a flat belt or a V belt, and it is driven at a constant speed in a clockwise direction in FIG. 12 by an auxiliary belt drive motor M42 (not shown in FIG. 12). The auxiliary belt 53 serves to accelerate the press unit 6 along the rails by engaging with the V groove part 62g of the press unit 6.

The feed gear 54 is configured to engage with the V groove part 62g of the press unit 6. The feed gear 54 is driven to rotate in the clockwise direction in FIG. 12 by a feed belt drive motor M43 (not shown in FIG. 12). The feed gear 54 is provided so as to feed out the press unit 6 from the waiting position to the antenna sheet AS that is conveyed. The operation timing of the feed gear 54 is controlled by a controller 200 (described later). Note that a feed belt having an outside V groove part may be employed instead of the feed gear 54.

Next, movement of the press unit circulation machine 5 will be described with reference to FIGS. 12 to 15.

Figure 13:
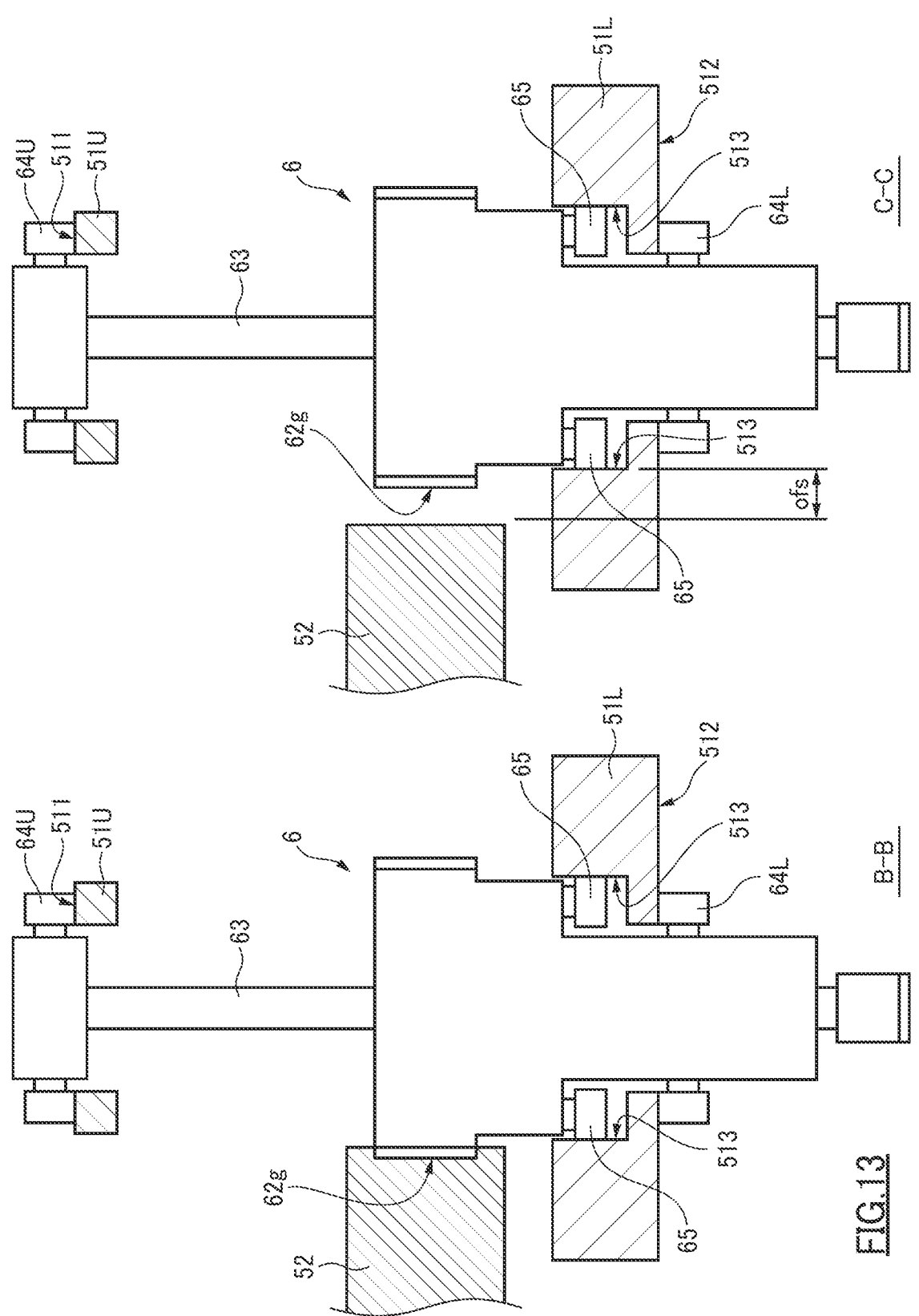
FIG. 13 shows a B-B section and a C-C section in FIG. 12.
Figure 14:
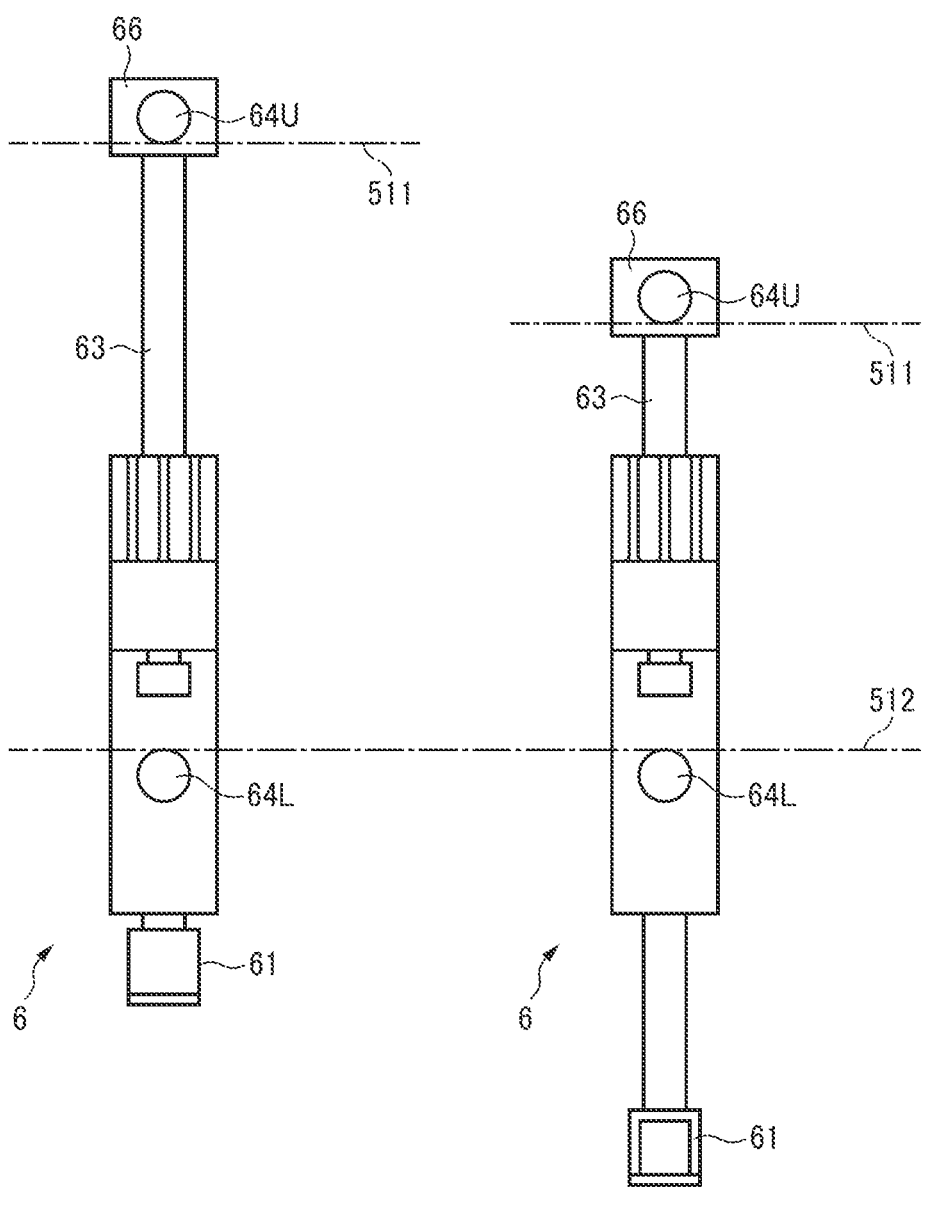
FIG. 14 illustrates positional relations of the press unit in a pulled state and a pressing state relative to rails in the press unit circulation machine.
Figure 15:
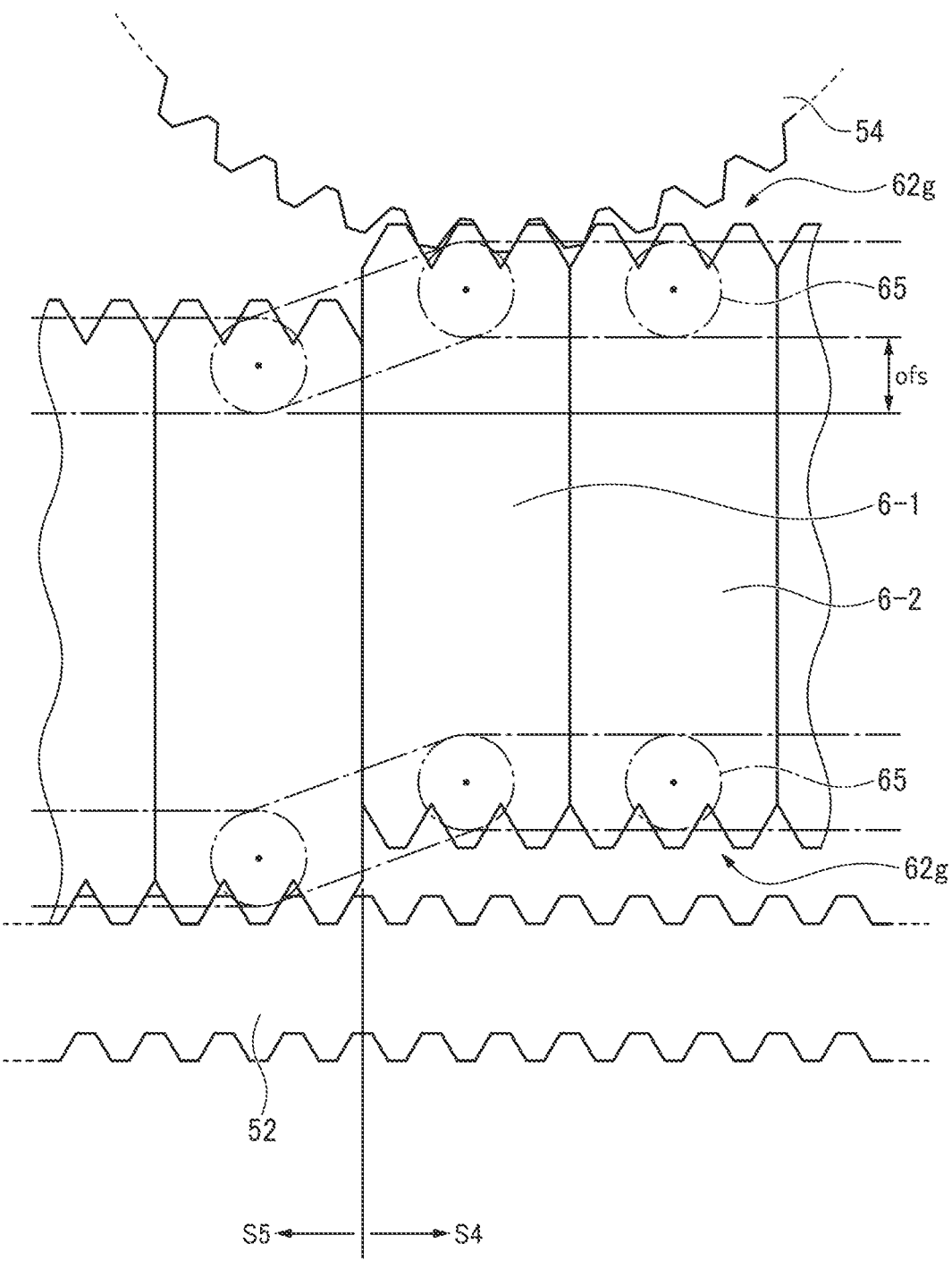
FIG. 15 illustrates movement of feeding out the press unit.

FIG. 13 shows a B-B section and a C-C section in FIG. 12. FIG. 14 illustrates positional relations of the press unit 6 in the pulled state and the pressing state relative to the circulation rail 51 in the press unit circulation machine 5. FIG. 15 illustrates movement of feeding out the press unit 6.

For convenience of the following explanation, the circulation route of the press unit 6 is divided into sections S1 to S5 in FIG. 12, and each section will be described in turn.

As shown in FIG. 13, the press unit 6 circulates on the circulation rail 51 while its pair of the upper rollers 64U rotate in contact with an upper surface 511 of the upper rail 51U, whereas its pair of the lower rollers 64L rotate in contact with a bottom surface 512 of the lower rail 51L.

Herein, the height of the bottom surface 512 of the lower rail 51L from the conveying surface of the conveyor 82 is constant along one round of the lower rail 51L.

In contrast, the height of the upper surface 511 of the upper rail 51U from the conveying surface of the conveyor 82 varies within one round. Specifically, the upper surface 511 of the upper rail 51U is lowest in the section S1 and is highest in the sections S3 and S4 in FIG. 12. The height of the upper surface 511 of the upper rail 51U gradually increases in the section S2 as it goes in the counterclockwise direction in FIG. 12, but it gradually decreases in the section S5 as it goes in the counterclockwise direction in FIG. 12.

When the press unit 6 is in the section S1, due to the upper surface 511 of the upper rail 51U being lowest in one round, the press unit 6 is in the pressing state close to the free state, and the pressing part 61 is at the lowest position in one round. The positions of the upper surface 511 of the upper rail 51U and the bottom surface 512 of the lower rail 51L are set so that the press unit 6 in this state will come into contact with and press the antenna.

As shown in FIG. 12, each press unit 6 moves immediately above each antenna of the antenna sheet AS along the conveying direction D1 of the antenna sheet AS, in the section S1. In the section S1, the V groove part 62g of each press unit 6 engages with the main belt 52, and thus, each press unit 6 moves in accordance with the speed of the main belt 52.

As described above, in the section S1, due to the upper surface 511 of the upper rail 51U being lowest in one round, each press unit 6 is in the pressing state close to the free state, whereby the pressing part 61 protrudes downward, as shown in FIG. 14. As shown in FIG. 9, the press unit 6 in the pressing state presses the IC chip, which is placed on the conductive paste on the corresponding antenna of the antenna sheet AS, by using the repulsive force of the spring contained in the press unit 6.

In the section S2, as described above, the height of the upper surface 511 of the upper rail 51U gradually increases as it goes in the counterclockwise direction in FIG. 12. Accordingly, the shaft 63 is gradually raised (pulled up) against the restoring force of the spring, and the pulled state in FIG. 14 is made at the last in the section S2. In the section S2, the V groove part 62g of each press unit 6 engages with the main belt 52, and thus, each press unit 6 moves in accordance with the speed of the main belt 52.

In the section S2, the upper surface 511 of the upper rail 51U gradually rises from its height in the section S1. Accordingly, the roller holder 66 of each press unit 6 is pulled up against the restoring force of the spring, and the pressing part 61 moves up accordingly.

Upon reaching the start position of the section S3, the press unit 6 is disengaged from the main belt 52. That is, as appreciated with comparison between the B-B cross section and the C-C cross section in FIG. 13, the upper rail 51U and the lower rail 51L are offset to the outside as a whole (offset amount ofs in FIG. 13) in the sections S3 and S4 (refer to the C-C cross section) relative to the last position in the section S2 and the start position in the section S5 (each refer to the B-B cross section). The pair of the lateral rollers 65 of the press unit 6 rotates along an inside surface 513 of the lower rail 51L, whereby the V groove part 62g of the press unit 6 comes away from the main belt 52.

In the section S3, after the press unit 6 is separated from the main belt 52, the auxiliary belt 53, which rotates in the clockwise direction in FIG. 12, comes into contact with and strongly pushes out the outside V groove part 62g of the press unit 6. This accelerates the press unit 6 in the counterclockwise direction along the circulation rail 51. The press unit 6 is accelerated in the section S3 in order to avoid a situation in which a number of the press units 6 is insufficient in the section S4, which is a waiting section of the press units 6.

In the section S3 and in the section S4 (described later), the upper surface 511 of the upper rail 51U is highest in one round, and each press unit 6 is in the pulled state as shown in FIG. 14.

The section S4 is a waiting section (an example of a waiting position) where a plurality of the press units 6, which have been sequentially sent from the section S3 while accelerated, waits until they are fed out. As described above, the press unit 6 preferably contains a permanent magnet in the housing 62. In this state, the magnetic forces cause a plurality of the press units 6 to closely fit to each other in a mutually overlapping manner while waiting.

In the section S4, the feed gear 54 engages with the V groove part 62g of a leading press unit 6 among the plurality of the press units 6 that are waiting. Under these conditions, the feed gear 54 rotates in the clockwise direction in FIG. 12 at a time determined by the controller 200 (described later) to feed out the leading press unit 6. The press units 6 overlap one another by the magnetic forces in the waiting section, and therefore, the press units 6 are fed out from the waiting section S4 one by one at exact times.

The operation of feeding out the press unit 6 will be further described with reference to FIG. 15. FIG. 15 shows an engagement state of the V groove parts 62g with the main belt 52 and the feed gear 54 of the press units 6 in the vicinity of the feed gear 54.

As shown in FIG. 15, in the waiting section S4, the inside V groove parts 62g of a plurality of press units 6-1, 6-2, and so on do not engage with the main belt 52, whereas the outside V groove part 62g of the leading press unit 6-1 engages with the feed gear 54. In this state, upon rotation of the feed gear 54 in a clockwise direction based on an instruction from the controller 200 (described later), the press unit 6-1 moves left in FIG. 15 and is fed out. The lower rail 51L is formed so that the pair of the lateral rollers 65 of the press unit 6 will move on a track shown by the virtual lines (that is, move to the main belt 52 by the offset amount ofs, which is shown also in FIG. 13) at this time. Thus, the press unit 6-1 that is pushed out moves inward to the main belt 52, and the inside V groove part 62g comes to engage with the main belt 52 at the start position of the section S5. After the inside V groove part 62g engages with the main belt 52, the press unit 6-1 moves following the movement of the main belt 52 in the section S5.

That is, in the section S5, the V groove part 62g of each press unit 6 engages with the main belt 52, and thus, each press unit 6 moves in accordance with the speed of the main belt 52.

As described above, the height of the upper surface 511 of the upper rail 51U gradually decreases as it goes in the counterclockwise direction in FIG. 12. Accordingly, the shaft 63 is gradually lowered by the restoring force of the spring, and the pressing state in FIG. 14 is made at the last in the section S5. The pressing state is a state in which the pressing part 61 of the press unit 6 is at the lowest position in one round and is ready to press each antenna that is conveyed. Each press unit 6 in this state advances to the section S1 and presses the IC chip placed on the conductive paste of each antenna that is conveyed.

As described above, each press unit 6 moves up and down in the direction orthogonal to the conveying surface while circulating along the track (sections S1 to S5) of the circulation rail 51, and it presses the IC chip that is placed on the conductive paste of the antenna AN. The press unit 6 circularly moves, whereby a predetermined number of the press units 6 can be continuously used for pressing.

Figure 16:
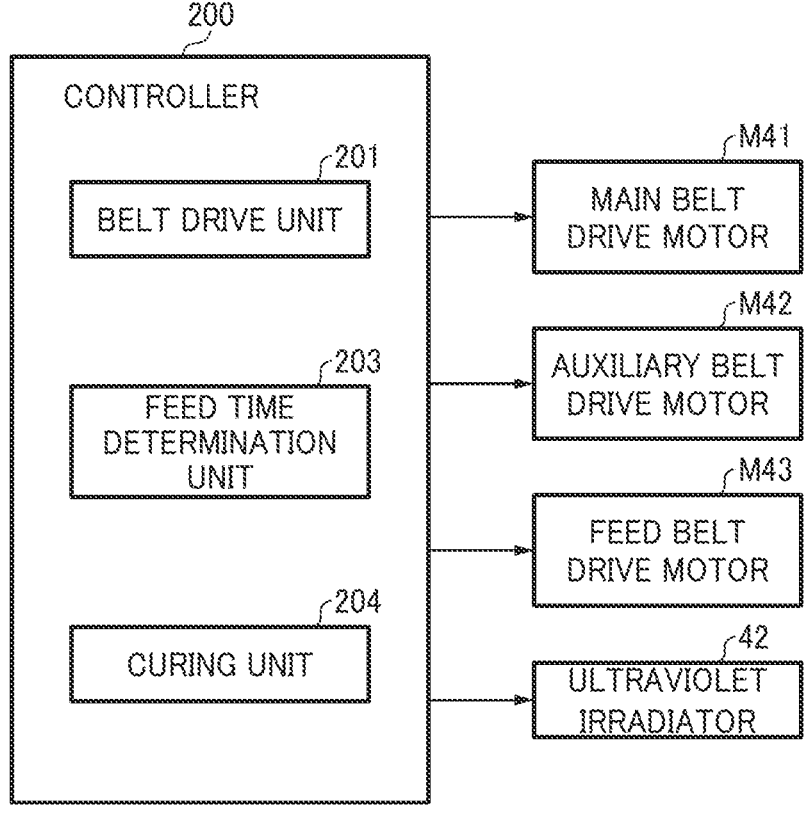
FIG. 16 is a functional block diagram of a controller for controlling the curing device.

Next, control of the curing device 4 performed by the controller 200 will be described with reference to FIG. 16. FIG. 16 is a functional block diagram of the controller 200.

The controller 200 is mounted on a circuit board (not shown) and is electrically connected to the image capture device CA4, the main belt drive motor M41, the auxiliary belt drive motor M42, the feed belt drive motor M43, and the ultraviolet irradiator 42.

The controller 200 includes a microcomputer, memories (random access memory (RAM) and read only memory (ROM)), a storage, and drive circuits. The microcomputer reads and executes a program recorded in the memory, and it implements each function of a belt drive unit 201, a feed time determination unit 203, and a curing unit 204.

The belt drive unit 201 transmits control signals to drive circuits of the main belt drive motor M41 and the auxiliary belt drive motor M42 so that the main belt 52 and the auxiliary belt 53 will be driven at respective constant speeds. The belt drive unit 201 transmits a control signal to a drive circuit of the feed belt drive motor M43 in accordance with the feed time determined by the feed time determination unit 203. The feed gear 54 rotates at the feed time accordingly. As a result, as shown in FIG. 15, the leading press unit 6 in the waiting section is fed out.

The feed time determination unit 203 determines feed time when the leading press unit 6 is fed out among a plurality of the press units 6 in the waiting section of the press unit circulation machine 5. The feed time is determined in consideration of each of these parameters: the speed of the main belt 52, and the conveying speed of the conveyor 82. That is, the feed time of each press unit 6 is determined based on each parameter so that each press unit 6 that is sequentially fed out from the waiting section S4 will meet each corresponding antenna AN passing through the image capture device CA4, at the start position of the section S1.

The curing unit 204 transmits a predetermined drive signal to the ultraviolet irradiator 42 so that the ultraviolet irradiator 42 will emit ultraviolet light to each antenna AN that is conveyed, by an integrated light amount that is preliminarily set.

As aforementioned, a strip antenna sheet having a plurality of antennas that are formed on a base material at constant pitches is supplied to the line, and it is subjected to the IC chip placement process and the curing process, whereby the IC chip is mounted on each antenna. In the IC chip mounting apparatus of this embodiment, the adhesive is applied to the reference position of the antenna and then the IC chip is placed on the adhesive in the IC chip placement process, and the adhesive is cured to strongly connect the antenna and the IC chip in the curing process. Particularly in the curing process of the present embodiment, irradiation of light is performed while the IC chip on the conductive paste is pressed to the antenna, without stopping conveyance of the antenna sheet on which a plurality of antenna is formed. This enables high productivity in mounting IC chips on antennas. That is, productivity gain in an inlay manufacturing process is achieved.

Although an embodiment of the IC chip mounting apparatus and the IC chip mounting method is described above, the present invention should not be limited to the foregoing embodiment. In addition, the embodiment described above may be various modified and altered within the scope not departing from the gist of the present invention.

In an example, although the antenna sheet AS is conveyed on the conveyor 81 in one direction in the IC chip placement process in the embodiment shown in FIG. 3, the conveying method is not limited thereto.

Figure 17:
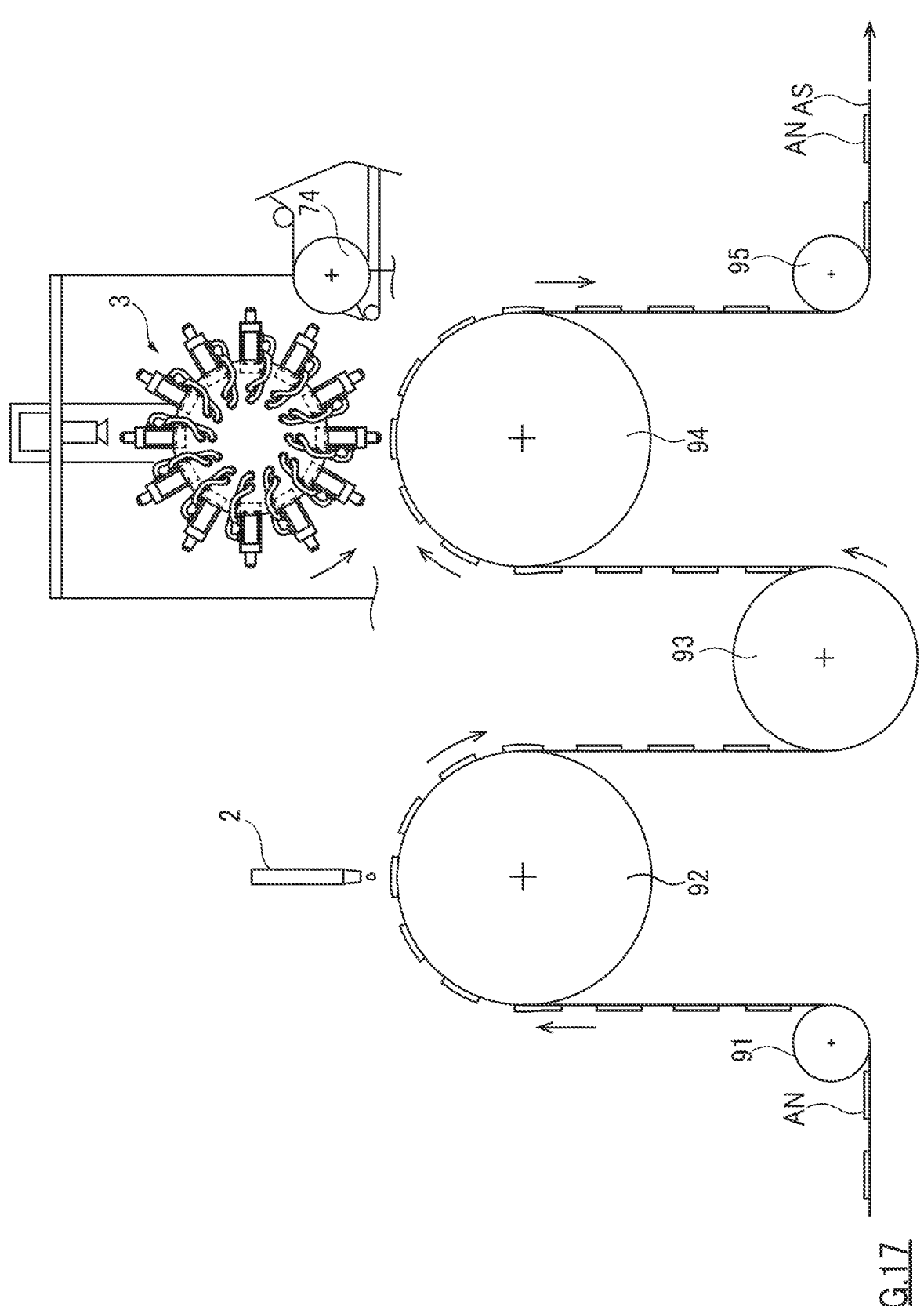
FIG. 17 shows a method of conveying the antenna sheet of an embodiment.

In an embodiment, as shown in FIG. 17, the antenna sheet AS may be conveyed by suction drums 92 and 94 and a plurality of conveying rollers (e.g., conveying rollers 91, 93, and 95 in FIG. 17) in the IC chip placement process. In FIG. 17, the dispenser 2 ejects the conductive paste to the reference position of the antenna AN of the antenna sheet AS, at the highest position of the suction drum 92. In addition, the IC chip is placed on the conductive paste at the highest position of the suction drum 94. In this case, at least the suction drums 92 and 94 are preferably suction rollers that suck the back surface of the antenna sheet AS. This structure prevents dislocation of the antenna sheet AS (in particular, in the longitudinal direction), whereby ejection of the conductive paste as well as placement of the IC chip is performed with high accuracy.

In an embodiment, instead of releasing the IC chip on the conductive paste applied to the antenna AN on the conveyed antenna sheet AS, the IC chip may be placed by pressing it to the conductive paste.

Figure 18:
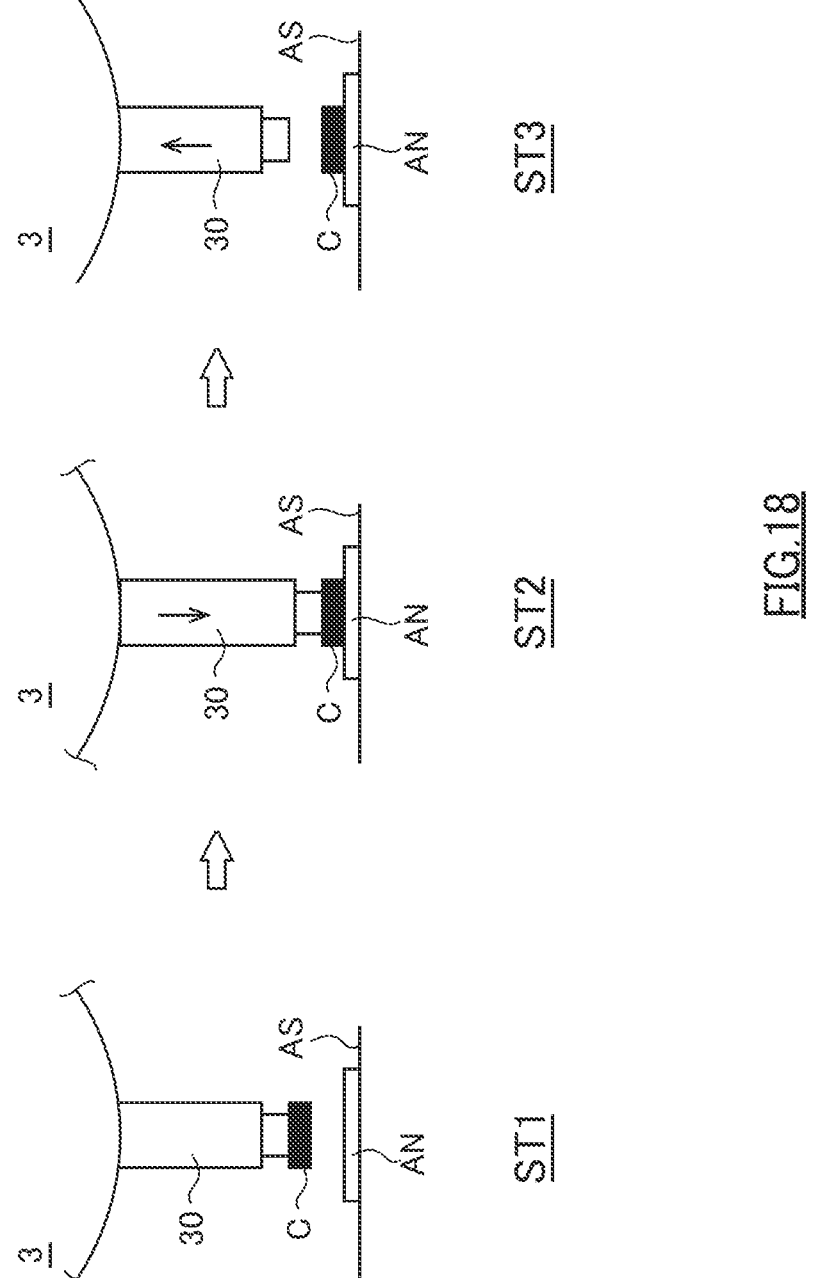
FIG. 18 illustrates the IC chip placement process of an embodiment.

FIG. 18 shows movement of the rotary mounter 3 in time series in the case of placing the IC chip by pressing it to the conductive paste. In an embodiment, nozzle units 30 of the rotary mounter 3 are configured to move in respective radial directions (diameter directions) by a built-in drive device.

The state ST1 is a state in which the nozzle unit 30 sucks the IC chip "C". Placement of the sucked IC chip "C" is performed in the state ST2. That is, the nozzle unit 30 is moved toward the reference position (that is, in the lower direction which is the Z-direction in FIG. 2) in such a manner as to extend in the radial direction (diameter direction). The IC chip "C" is then placed on the conductive paste by pressing it to the conductive paste applied to the antenna AN. After the IC chip "C" is placed, the suction is released, and the nozzle unit 30 is returned to the position in the state ST1. For example, the movement from the state ST1 to the state ST3 is performed at the time the nozzle unit 30 reaches the position PK (refer to FIG. 6), whereby the IC chip "C" is placed on the conductive paste applied on the antenna AN.

The curing process may not use the curing device 4 that circulates the press units 6.

Figure 19:
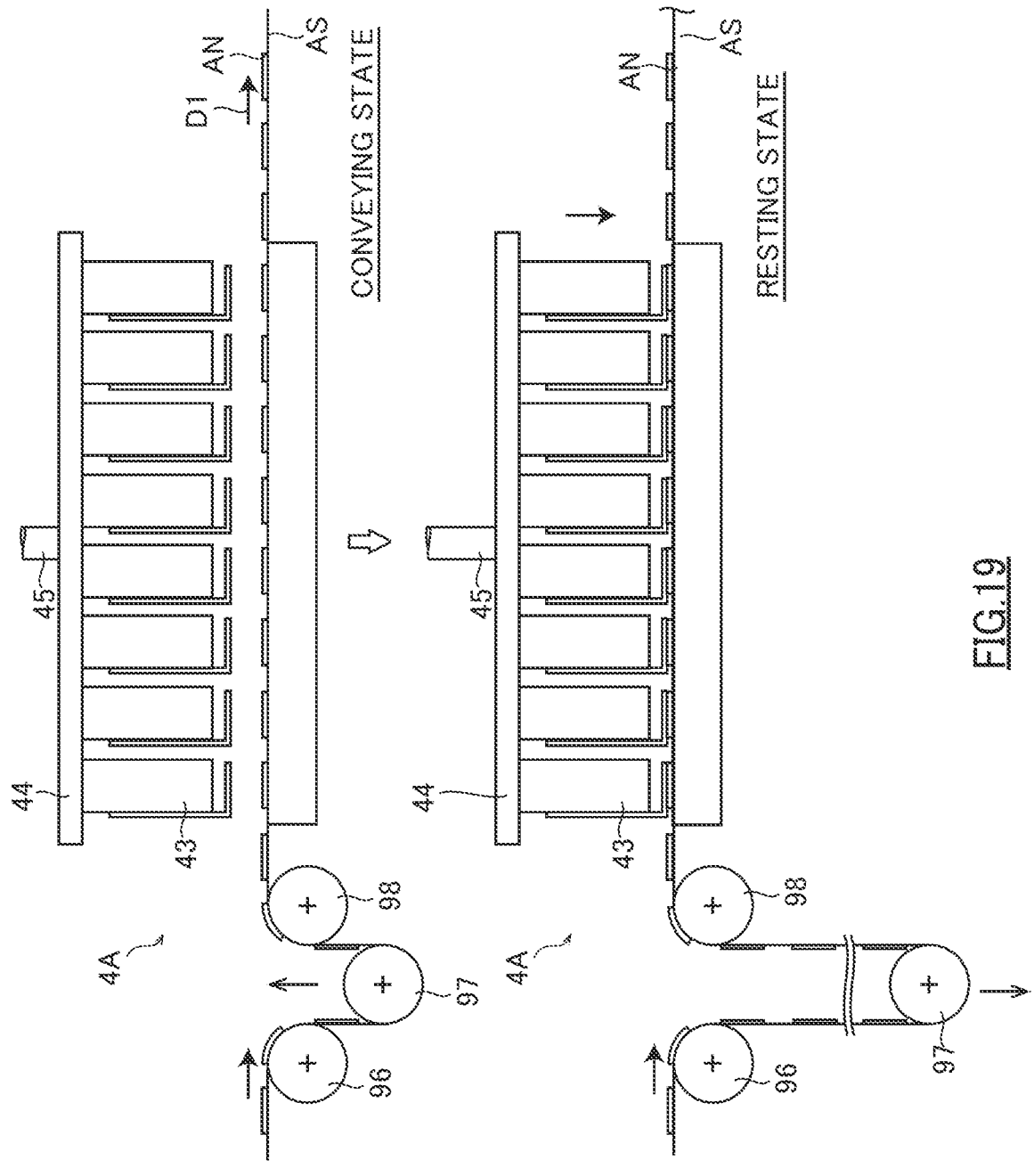
FIG. 19 illustrates the curing process of an embodiment.

The curing process of an embodiment is shown in FIG. 19. FIG. 19 shows a curing device 4A that is used in the curing process of an embodiment. The curing device 4A includes a plurality of ultraviolet curing units 43 that are detachably mounted to a mounting board 44. A plurality of mounting boards 44 that have different mounting positions are prepared in accordance with the interval of adjacent antennas AN of the antenna sheet AS. Under these conditions, the mounting boards 44 are switched in response to the interval, whereby various antenna sheets AS can be used in the curing device 4A.

A support shaft 45 supports and moves the mounting board 44 up and down. The antenna sheet AS that is conveyed from the IC chip placement process is sent to the curing process via conveying rollers 96 to 98. The conveying roller 97 is moved up and down by a drive device (not shown).

Figure 20:
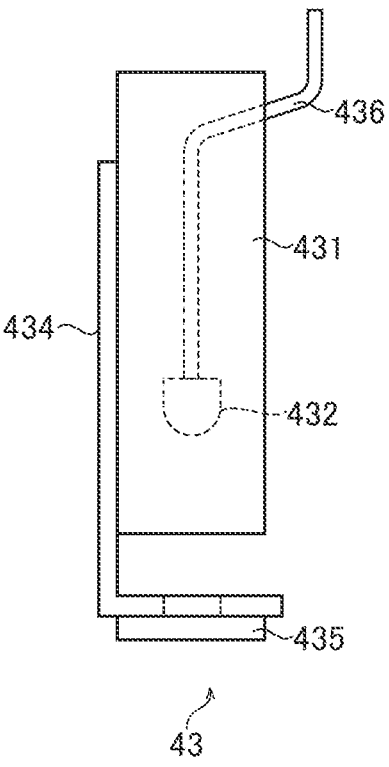
FIG. 20 shows a configuration example of an ultraviolet curing unit in FIG. 19.

An example of the structure of the ultraviolet curing unit 43 is shown in FIG. 20. As shown in FIG. 20, the ultraviolet curing unit 43 contains a light source 432 (e.g., an LED light source) for emitting ultraviolet light, in a housing 431. The light source 432 is powered via a cable 436 (not shown in FIG. 19) that is provided from the outside of the ultraviolet curing unit 43. A condensing lens for condensing ultraviolet light that is emitted by the light source 432 may be provided in the housing 431. A holding plate 434 is coupled to the housing 431 and holds a glass plate 435. The ultraviolet light that is emitted from the light source 432 illuminates and cures the conductive paste applied to each antenna AN.

With reference to FIG. 19 again, the conveying state is a state in which the antenna sheet AS is conveyed from the IC chip placement process. The conveyance of the antenna sheet AS is stopped at the time the antennas AN applied with uncured conductive paste come immediately under the ultraviolet curing units 43. Then, in the state (resting state) in which the conveyance of the antenna sheet AS is rested, the ultraviolet curing units 43 are lowered, and they emit ultraviolet light to cure the conductive paste while pressing the antennas AN with the glass plates 435.

The antenna sheet AS is conveyed from the IC chip placement process during the resting state, and therefore, the conveying roller 97 is lowered by its own weight and absorbs the conveyed antenna sheet AS between the conveying rollers 96 and 98 while ultraviolet light is emitted. After emission of ultraviolet light is finished, the antennas AN, number of which corresponds to the number of the ultraviolet curing units 43, are quickly conveyed to a downstream side, and instead, uncured antennas AN are then stopped at the positions immediately under the ultraviolet curing units 43. That is, in the curing process of an embodiment, the conveying state and the resting state (ultraviolet light emission state) of the antenna sheet AS are repeated. In quickly conveying the antennas AN, the conveying roller 97 is raised by tension applied to the antenna sheet AS.

The curing process of an embodiment may use a thermosetting device. That is, in the case of applying a thermosetting adhesive, such as an epoxy resin, by the dispenser 2, the adhesive is cured by a thermosetting treatment in the curing process.

Figure 21:
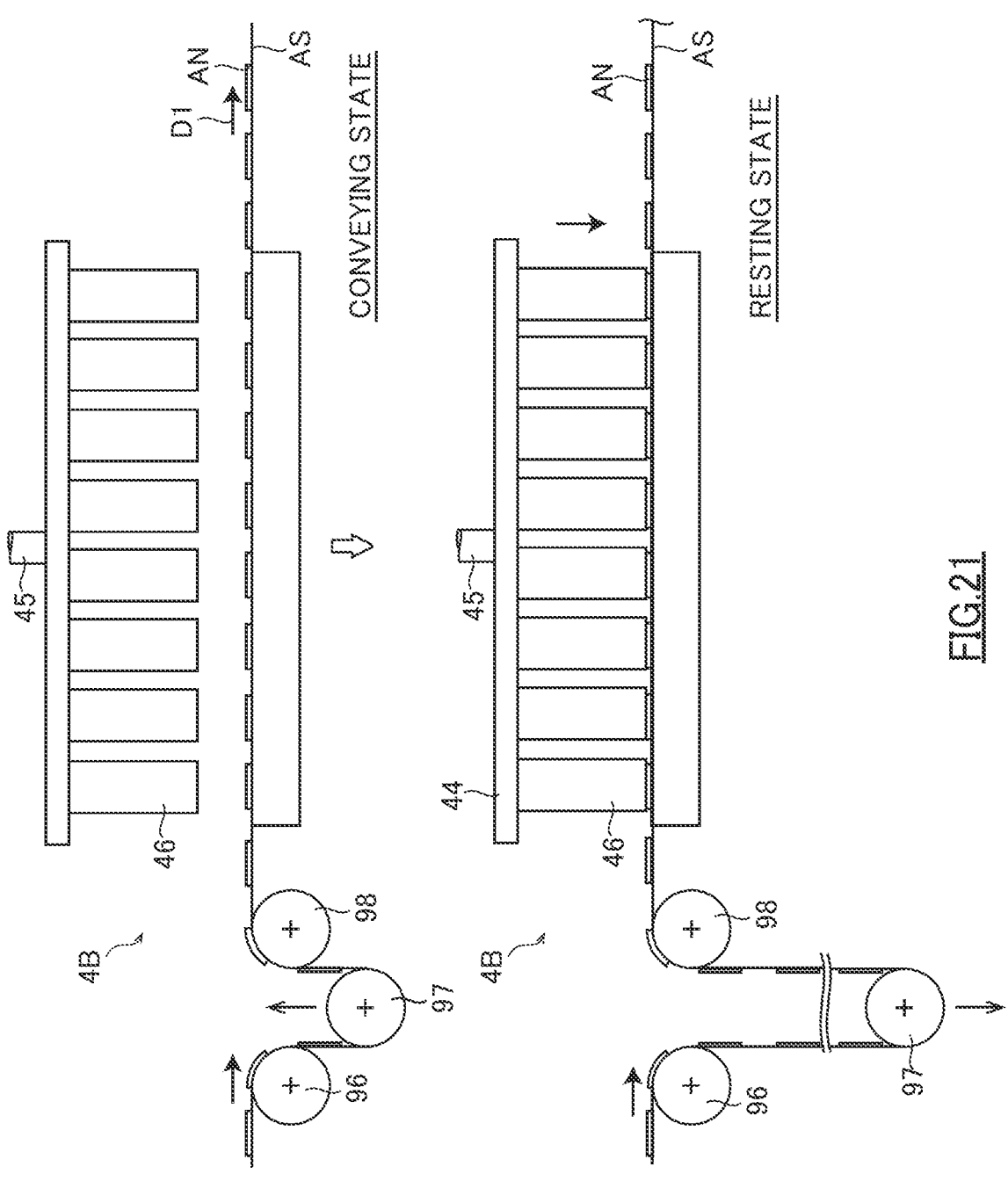
FIG. 21 illustrates the curing process of an embodiment.

FIG. 21 shows a curing device 4B configured so that the conveying state and the resting state of the antenna sheet AS will be repeated as in the case in FIG. 19. The curing device 4B is different from the curing device 4A in having a plurality of thermosetting units 46. A heat source that is operated by power supplied via a cable (not shown) is disposed to each thermosetting unit 46. While the antenna sheet AS is in the resting state, the support shaft 45 is driven so as to move down, and each thermosetting unit 46 heats and cures the adhesive while pressing the corresponding antenna AN. After heating is completed, the support shaft 45 is driven so as to move up, and the antenna sheet AS is conveyed.

In the case of curing the conductive paste with ultraviolet light in FIG. 19, instead of the ultraviolet curing unit 43 containing the light source, a press unit for pressing the antenna AN via a glass plate may be used. In addition, an ultraviolet irradiator may also be provided in such a manner as to emit ultraviolet light from an outside in the width direction or an oblique upper side to the conductive paste on the antenna AN that is pressed in the resting state.

In an embodiment, in order to not make the antenna sheet AS in the resting state during emission of ultraviolet light, the plurality of the ultraviolet curing units 43 may be circulated in a manner linked to the advance speed of the antenna sheet AS, and ultraviolet light may be emitted by the internal light source while the antenna AN is pressed, as shown in FIG. 9.

Similarly, in an embodiment, in thermally curing the conductive paste, the plurality of the thermosetting units 46 may be circulated in a manner linked to the advance speed of the antenna sheet AS, and the antenna AN may be heated while being pressed.

The invention claimed is:

1. An IC chip mounting apparatus comprising:
   a conveyor configured to convey an antenna continuous body on a conveying surface, the antenna continuous body having a base material and a plurality of inlay antennas continuously formed on the base material;
   an IC chip placement unit configured to place an IC chip on a photo-curable adhesive that is located on a reference position of each of the inlay antennas of the antenna continuous body; and
   a light irradiator configured to irradiate, with light, the photo-curable adhesive located on each of the inlay antennas of the antenna continuous body,
   wherein the light irradiator is configured to irradiate the photo-curable adhesive located on each of the inlay antennas with the light while the IC chip on the photo-curable adhesive is pressed to each of the inlay antennas.

2. The IC chip mounting apparatus according to claim 1, wherein the light irradiator is disposed along a conveying direction of the antenna continuous body on the conveying surface.

3. The IC chip mounting apparatus according to claim 1, further comprising a press unit that moves up and down in a direction orthogonal to the conveying surface, the press unit configured to press the IC chip on the photo-curable adhesive.

4. The IC chip mounting apparatus according to claim 3, further comprising a press unit moving machine configured to move the press unit from a waiting position toward one of the inlay antennas on the conveying surface and circulate the press unit on a circular track along the conveying surface.

5. The IC chip mounting apparatus according to claim 4, further comprising a plurality of the press units,
   wherein the press unit moving machine is configured to move each of the press units from the waiting position at predetermined times.

6. The IC chip mounting apparatus according to claim 3, wherein the press unit has a pressing surface for pressing the IC chip on the photo-curable adhesive, the pressing surface being made of glass through which the light passes.

7. The IC chip mounting apparatus according to claim 3, wherein the light irradiator comprises the press unit.

8. An IC chip mounting apparatus comprising:
   a conveyor configured to convey an antenna continuous body on a conveying surface, the antenna continuous body having a base material and a plurality of inlay antennas continuously formed on the base material;
   an IC chip placement unit configured to place an IC chip on a thermosetting adhesive that is located on a reference position of each of the inlay antennas of the antenna continuous body; and a thermal curing unit configured to apply heat to the thermosetting adhesive located on the each of the inlay antennas of the antenna continuous body that is conveyed by the conveyor, wherein the thermal curing unit is configured to apply heat to the thermosetting adhesive located on each of the inlay antennas while the IC chip on the thermosetting adhesive is pressed to each of the inlay antennas.

9. An IC chip mounting method comprising:

conveying an antenna continuous body on a conveying surface, the antenna continuous body having a base material and a plurality of inlay antennas continuously formed on the base material;

placing an IC chip on a photo-curable adhesive that is located on a reference position of each of the inlay antennas of the antenna continuous body; and irradiating, with light, the photo-curable adhesive located on each of the inlay antennas of the antenna continuous body while pressing the IC chip on the photo-curable adhesive to each of the inlay antennas.

10. The IC chip mounting method according to claim 9, wherein the pressing the IC chip on the photo-curable adhesive to each of the inlay antennas is performed by a press unit moving up and down in a direction orthogonal to the conveying surface.

11. The IC chip mounting method according to claim 10, further comprising:

moving the press unit from a waiting position toward one of the inlay antennas on the conveying surface; and circulating the press unit on a circular track along the conveying surface.

12. The IC chip mounting method according to claim 11, further comprising:

moving each of a plurality of the press units from the waiting position at predetermined times.

13. The IC chip mounting apparatus according to claim 2, further comprising a press unit that moves up and down in a direction orthogonal to the conveying surface, the press unit configured to press the IC chip on the photo-curable adhesive.

14. The IC chip mounting apparatus according to claim 4, wherein the press unit has a pressing surface for pressing the IC chip on the photo-curable adhesive, the pressing surface being made of glass through which the light passes.

15. The IC chip mounting apparatus according to claim 5, wherein the press unit has a pressing surface for pressing the IC chip on the photo-curable adhesive, the pressing surface being made of glass through which the light passes.

16. An IC chip mounting apparatus comprising:

a light irradiator configured to irradiate, with light, an adhesive on which an IC chip is placed, the adhesive being applied on each of a plurality of antennas of an antenna continuous body;

a press unit configured to press the IC chip on the adhesive to each of the antennas, wherein:

the light irradiator is configured to irradiate the adhesive applied on each of the antennas with the light while the press unit presses the IC chip on the adhesive to each of the antennas, and the press unit is configured to transmit the light irradiated from the light irradiator while pressing the IC chip on the adhesive to each of the antennas so that the transmitted light irradiates the adhesive.

17. The IC chip mounting apparatus according to claim 16, wherein the light irradiator is disposed along an extending direction of the antenna continuous body.

18. The IC chip mounting apparatus according to claim 16, wherein the press unit is disposed above the IC chip on the antenna continuous body.

19. An IC chip mounting method comprising:

pressing, with a press unit, an IC chip on an adhesive to an antenna of an antenna continuous body, the adhesive being applied on the antenna; and irradiating, with light, the adhesive of the antenna of the antenna continuous body while pressing the IC chip on the adhesive to the antenna with the press unit, wherein:

the press unit transmits the light while pressing the IC chip on the adhesive to the antenna so that the transmitted light irradiates the adhesive.

20. The IC chip mounting method according to claim 19, wherein the press unit is disposed above the IC chip on the antenna continuous body.

* * * * *